(12) United States Patent
Shimamoto et al.

(10) Patent No.: US 7,119,407 B2
(45) Date of Patent: Oct. 10, 2006

(54) SEMICONDUCTOR DEVICE AND MANUFACTURING METHOD THEREOF

(75) Inventors: Yasuhiro Shimamoto, Hachioji (JP); Katsunori Obata, Hachioji (JP); Kazuyoshi Torii, Tsukuba (JP); Masahiko Hiratani, Akishima (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/900,430

(22) Filed: Jul. 28, 2004

(65) Prior Publication Data

US 2004/0262642 A1 Dec. 30, 2004

Related U.S. Application Data

(63) Continuation of application No. 10/216,792, filed on Aug. 13, 2002, now Pat. No. 6,787,451.

(30) Foreign Application Priority Data

Aug. 27, 2001 (JP) ............................. 2001-255454

(51) Int. Cl.
*H01L 29/72* (2006.01)
(52) U.S. Cl. ....................................... 257/408
(58) Field of Classification Search ................ 257/408
See application file for complete search history.

(56) References Cited

U.S. PATENT DOCUMENTS 6,020,024 A * 2/2000 Maiti et al. ................. 438/287
6,140,167 A * 10/2000 Gardner et al. ............. 438/197
2002/0050608 A1 5/2002 Landheer et al.

FOREIGN PATENT DOCUMENTS

JP 11-135774 7/1998

OTHER PUBLICATIONS

Laegu Kang, Yongjoo Jeon, Katsunori Onishi, Byoung Hun Lee, Wen-Jie Qi, Renee Nieh, Sundar Gopalan and Jack C. Lee, "Single-Layer Thin $HfO_2$ Gate Dielectric with n+—Polysilicon Gate", 2000 Symposium on VLSI Technology Digest of Technical Papers, p. 2.
Seiichi Iwata and Akitoshi Ishizaka, "Electron Spectroscopic Analysis of the $SiO_2$/Si System and Correlation with Metal-Oxide-Semiconductor Device Characteristics", J. Appl. Phys., vol. 79, No. 9, May 1, 1996, pp. 6653-6713.

(Continued)

*Primary Examiner*—Edward Wojciechowicz
(74) *Attorney, Agent, or Firm*—Reed Smith LLP; Stanley P. Fisher, Esq.; Juan Carlos A. Marquez, Esq.

(57) ABSTRACT

In a method for manufacturing an FET having a gate insulation film with an $SiO_2$ equivalent thickness of 2 nm or more and capable of suppressing the leak current to 1/100 or less compared with existent $SiO_2$ films, an $SiO_2$ film of 0.5 nm or more is formed at a boundary between an Si substrate (polycrystalline silicon gate) and a high dielectric insulation film, and the temperature for forming the $SiO_2$ film is made higher than the source-drain activating heat treatment temperature in the subsequent steps. As such, a shifting threshold voltage by the generation of static charges or lowering of a drain current caused by degradation of mobility can be prevented so as to reduce electric power consumption and increase current in a field effect transistor of a smaller size.

4 Claims, 11 Drawing Sheets

OTHER PUBLICATIONS

D.A. Buchanan, E.P. Gusev, E. Cartier, H. Okom-Schmidt, K. Rim, M.A. Gribelyuk, A. Mocuta, A. Ajmera, M. Copel, S. Guha, N. Borjarczuk, A. Callegari, C. D'Emic, P. Kozlowski, K. Chan, R. J. Fleming, P. C. Jamison, J. Brown, R. Amdi, "80 nm Poly-Silicon Gated n-FETs with Ultra-Thin $Al_2O_3$ Gate Dielectric for ULSI Applications", 2000 IEEE, pp. 2-3.

Wen-Jie Qi, Renee Nieh, Byoung Hun Lee, Laegu Kang, Yongjoo Jeon, Katsunori Onishi, Tat Ngai, Sunjay Banerjee and Jack C. Lee, "MOSCAP and MOSFET Characteristics Using $ZrO_2$ Gate Dieletric Deposited Directly on Si", 1999 IEEE, pp. 1-2.

* cited by examiner $Al_2O_3$ GATE INSULATION FILM ①
  POLYCRYSTALLINE SILICON/$SiO_2$ 0.5 nm/$Al_2O_3$ 1.0 nm/$SiO_2$ 0.6 nm/ Si SUBSTRATE
  OXIDATION TREATMENT TEMPERATURE=1000°C, ACTIVATING HEAT TREATMENT TEMPERATURE=1000°C $Al_2O_3$ GATE INSULATIVE FILM ②
  POLYCRYSTALLINE SILICON/$Al_2O_3$ 1.5 nm/$SiO_2$ 0.6 nm/ Si SUBSTRATE
  OXIDATION TREATMENT TEMPERATURE=1000°C, ACTIVATING HEAT TREATMENT TEMPERATURE=1000°C

SEMICONDUCTOR DEVICE AND MANUFACTURING METHOD THEREOF

CROSS-REFERENCE TO RELATED APPLICATIONS

This application is a Continuation application of U.S. application Ser. No. 10/216,792 filed on Aug. 13, 2002. Priority is claimed based on U.S. application Ser. No. 10/216,792 filed on Aug. 13, 2002, U.S. Pat. No. 6,787,451 which claims priority to Japanese Patent Application No. 2001-255454 filed on Aug. 27, 2001.

FIELD OF THE INVENTION

This invention concerns a semiconductor device and a manufacturing method thereof and, more in particular, it relates to a semiconductor device having a field effect transistor in which a high dielectric film is applied to a gate insulation film for use in a field effect transistor, as well as a manufacturing method thereof.

BACKGROUND OF THE INVENTION

MOS transistors as a basic constituent circuit for large scale integrated circuits (LSI) have been highly integrated in accordance with a scaling rule. However, it is considered that the gate insulation film using silicon dioxide ($SiO_2$) is limited to a film thickness of 2.0 nm or less at the cost of increasing the consumption power and lowering reliability of the insulation film due to increase a direct tunnel leakage current. Further, since a diffusion barrier to impurities is weakened in such thin $SiO_2$, it brings about leakage of impurities from a gate electrode. Further, a stringent production control is necessary for mass production of thin $SiO_2$ films at a good uniformity.

In view of the above, for attaining further refinement and higher operation speed of the device simultaneously and breaking through the limit for the scaling, development for "High Dielectric Constant (high-K) Material" capable of obtaining a field effect performance equal to or superior to $SiO_2$ even when it is formed with a thickness larger than $SiO_2$ has been conducted actively. Potential candidate materials include IV group oxides such as zirconia ($ZrO_2$), hafnia ($HfO_2$), III group oxides such as alumina ($Al_2O_3$) and yttria ($Y_2O_3$) and silicates as solid solutions of such metal oxides and $SiO_2$. The group IV oxides and group III oxides are materials utilized as the gate insulation film in the early stage of Si semiconductors. However, after the technique for forming the gate insulation film with $SiO_2$ has been established, $SiO_2$ has been used exclusively in view of its excellent characteristics. For example, a field effect transistor (FET) using $ZrO_2$ for the gate insulation film is described in IEDM' 99 Tech. Digest, pp. 145, 1999. A field effect transistor using $HfO_2$ for the gate insulation film is described in 2000 Symposium on VLSI Technology Digest of Technical Papers, and a field effect transistor using alumina for the gate insulation film is described in IEDM' 00 Tech. Digest pp. 145, 2000. A method for manufacturing a metal silicate is described in JP-A-135774/1999.

Existing FET forming processes include, after forming the gate insulation film, a step of depositing a gate comprising, for example, polycrystalline silicon, a step of injecting impurities to the polycrystalline silicon gate, a step of fabricating the gate, a step of injecting impurities to a source-drain region, and a heating step of activating the impurities. Particularly, for the heating step (activating the impurities), a temperature of 900° C. or higher is desirable for controlling to a predetermined impurity profile. Accordingly, it is necessary for the gate insulation film comprising the high dielectric material to maintain interface characteristics at high quality even by the FET forming process including the heating step.

However, in a case of forming FET, for example, by applying $Al_2O_3$ to a gate insulation film, the following problems exist as described in IEDM' 00 Tech. Digest, pp 145. Since negative fixed charges are present in the insulation film, a flat band voltage of an N channel type MISFET shifts by 0.3 V or more toward a positive voltage and a threshold voltage of FET also changes. Further, since the mobility of electrons is small which is about ¼ compared with a universal curve of an $SiO_2$ film (general curve giving effective field effect dependence of mobility), the source— drain current upon operating FET can not be increased as expected. One of the reasons that the mobility of electrons is small is attributable to scattering of electrons in the channel because of the presence of negative fixed charges in the insulation film. Accordingly, for applying $Al_2O_3$ to the gate insulation film, it is necessary to remove the negative fixed charges in the insulation film.

The equivalent $SiO_2$ thickness (EOT) of a high dielectric gate insulation film is defined as below. When the thickness of an $SiO_2$ gate insulation film obtained by fixing a refractive index to 1.46 is $t_{ox}$ measured by an ellipsometer using a light at frequency of 784 nm, the $SiO_2$ equivalent film thickness (EOT) of the high dielectric gate insulation film having an identical electrical capacitance with that of an MOS capacitor formed by using the $SiO_2$ gate insulation film.

This invention intends to develop a high dielectric insulation film at high quality with less $SiO_2$ equivalent film thickness, less leakage current when compared by an identical equivalent film thickness, stable also to thermal load in the FET forming process and excellent in the boundary characteristics.

SUMMARY OF THE INVENTION

According to one aspect of the invention, the semiconductor device has a field effect transistor formed on a silicon substrate stacked with a metal oxide film having a higher dielectric constant than that of a silicon oxide film, and a gate insulation film with an $SiO_2$ equivalent thickness of 2.0 nm or less, wherein the gate insulation film comprises a first silicon oxide film or a silicon oxynitride film of a thickness of 0.5 nm or more formed between the silicon substrate and the metal oxide film.

According to another aspect of the invention, the method for manufacturing a semiconductor device having a field effect transistor in which a metal oxide film of a higher dielectric constant than that of a silicon oxide film formed on a silicon substrate is used as a gate insulation film, comprises: forming the metal oxide film on the silicon substrate; and forming a first silicon oxide film or a silicon oxynitride film with a thickness of 0.5 nm or more between the silicon substrate and the metal oxide film by a heat treatment in an oxidative atmosphere at a temperature higher than a source-drain activating temperature for forming the field effect transistor; and forming a gate of the field effect transistor on the metal oxide film after the heat treatment.

According to a third aspect of the invention, the method for manufacturing a semiconductor device having a field effect transistor in which a metal oxide film of a higher dielectric constant than that of a silicon oxide film formed on a silicon substrate is used as a gate insulation film, comprising: forming a silicon oxide film or a silicon oxynitride film with a thickness of 0.5 nm or more on the silicon substrate by a heat treatment in an oxidative atmosphere at a temperature higher than a source-drain activating temperature for forming the field effect transistor; forming a metal oxide film on the silicon oxide film or the silicon oxynitride film after the heat treatment; and forming a gate of the field effect transistor on the metal oxide film.

BRIEF DESCRIPTION OF THE DRAWINGS

The foregoing and additional features and characteristics of the present invention will become more apparent from the following detailed description considered with reference to the accompanying drawings in which like reference numerals designate like elements and wherein.

DETAILED DESCRIPTION OF THE PREFERRED EMBODIMENTS

For solving the foregoing problems, the present inventors have made a detailed study regarding (1) the relation between $SiO_2$ film at the boundary between the high dielectric material and the Si substrate; (2) the FET characteristic and the relation between the FET characteristic and the boundary $SiO_2$ film forming temperature; and (3) the relation between the FET characteristic and the gate electrode material.

Figure 8:
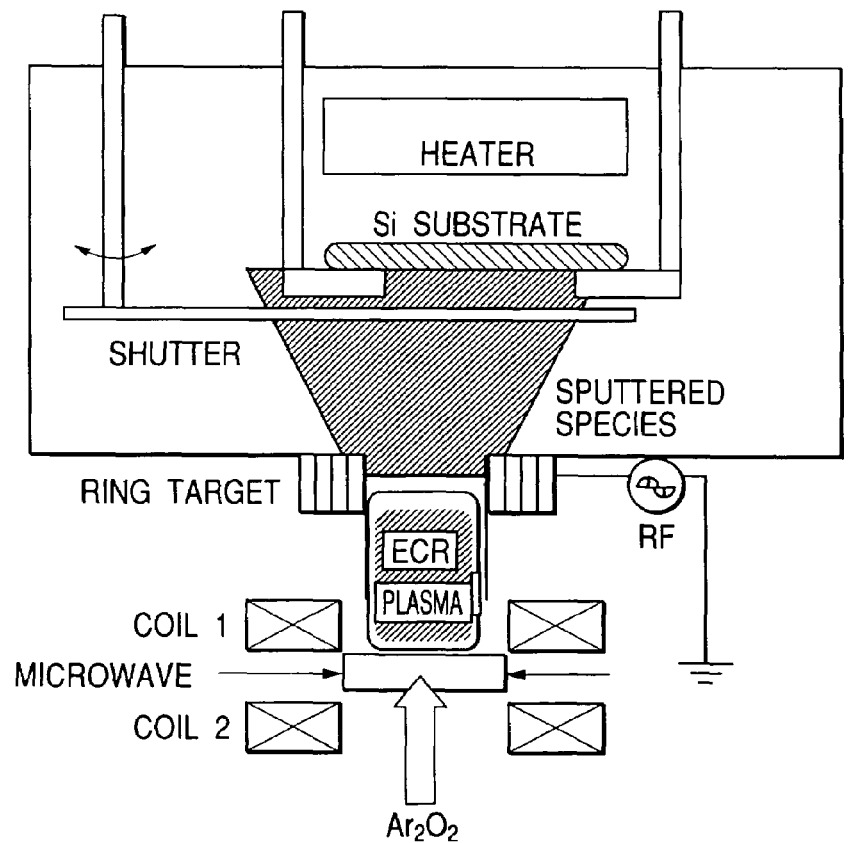
FIG. 8 is a schematic view of an ECR sputtering apparatus.

At first, the relation between the $SiO_2$ film at the boundary between the high dielectric material and the Si substrate, and the FET characteristic are to be described specifically. As the high dielectric material, an $Al_2O_3$ film is used as an example. The method of preparing $Al_2O_3$ is described below. After washing a Si single crystal substrate (resistivity: 10 Ωcm, 8 inch) with HF, an $Al_2O_3$ film is deposited by an ECR sputtering apparatus at a room temperature. The apparatus is shown in FIG. 8. The amount of Ar and $O_2$ supplied is controlled by a mass flow meter. Then, a microwave at 2.45 GHz is introduced under a constant magnetic field to generate ECR plasmas. The microwave power is 500 W. Further, sputtering is conducted by applying an RF electric field at 13.56 MHz to an Al ring target. The RF power is 500 W. In this apparatus, an Si substrate is placed remotely from the Al target, and the substrate surface is deflected by 90° relative to the sputtering target surface and located eccentrically. Further, the substrate potential is set at a floating potential (i.e., a potential results into net current collection from the plasma). Accordingly, plasma damages are reduced compared with usual DC magnetron sputter apparatus. Further, for making the deposition film thickness uniform within the plane, it is deposited while rotating a wafer at 25 rpm. Further, the apparatus is provided with a shutter mechanism, and a film is deposited after stabilizing ECR plasma discharge or sputtering discharge. The pressure in the film deposition chamber is usually at $1 \times 10^{-4}$ Pa, and a pressure upon gas introduction is $9 \times 10^{-2}$ Pa.

Sputtering is conducted in a state not oxidizing the surface of the Al target at the supply of Ar of 25 sccm and $O_2$ of 3.0 sccm. The analysis of a 30 nm film formed on Si by auger electron spectroscopy confirms that Al and O were uniformly distributed in the film, and the deposition film was $Al_2O_3$. Accordingly, it appears that the sputtered Al is oxidized with oxygen in the ECR plasmas on the Si substrate and formed into an $Al_2O_3$ film. The deposition rate of the $Al_2O_3$ film is 1.7 Å/s.

Figure 9:
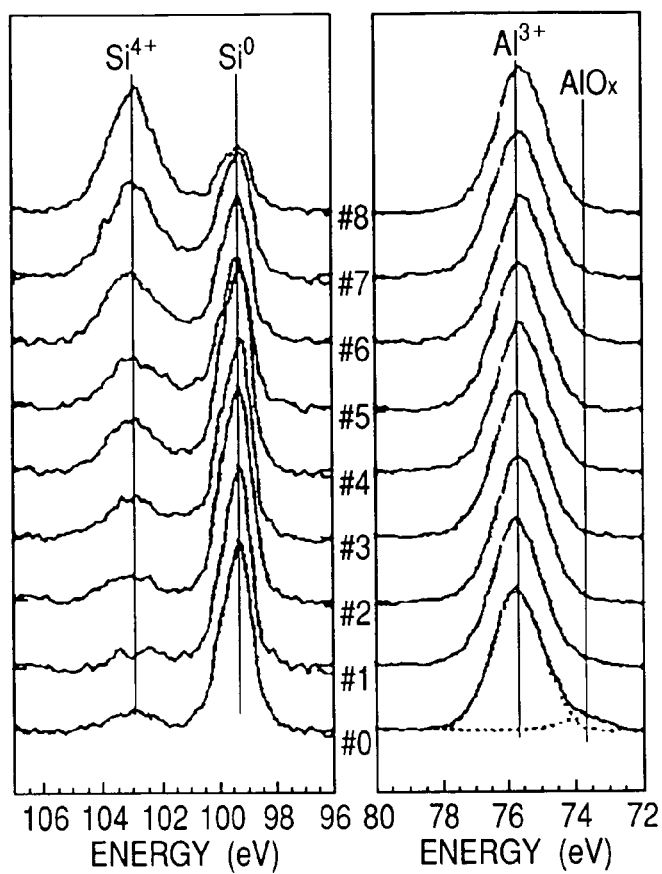
FIG. 9 shows XPS spectra of Si2p electrons and Al2p electrons for an $Al_2O_3/SiO_2/Si$ structure.

For forming a thin $SiO_2$ film as thin as possible at the $Al_2O_3$/Si boundary, the $Al_2O_3$ film is first deposited for 12 sec by using the method described above and, further, applied with heat treatment under vacuum at 450° C. for 10 min in the identical apparatus (Ar atmosphere, pressure: $7\times10^{-4}$ torr) and then taken out into atmospheric air. The delivery method is described below. The $SiO_2$ film thickness is 0.1 nm to 0.2 nm. By further applying heat treatment to the film in an oxidative atmosphere, an $SiO_2$ film is grown on the $Al_2O_3$/Si boundary. The $Al_2O_3$ film thickness determined by a TEM measurement is 2.0 nm±0.1 nm. FIG. 9 shows XPS spectra of Si2p electrons and Al2p electrons of the films applied with various oxidizing heat treatment conditions. The detection angle of photoelectrons is 30° in the direction parallel with the surface of a specimen. The energy position is decided by setting the Si—Si ($Si^{0+}$) bonding energy of Si substrate appearing in Si2p electron spectra as 99.2 eV. Further, all the numbers of detected Si2p photoelectrons are normalized by the peaks ($Al^{3+}$ bonding state of $Al_2O_3$) with a bonding energy of 75.7 eV observed in common with the Al2p electron spectra. On the other hand, a peak observed at 103.5 eV–104.0 eV in the Si2p electron spectra is $SiO_2$ bond ($Si^{4+}$). The decrease of $Si^{0+}$ intensity and the increase of $Si^{4+}$ intensity in the sequence of specimen numbers correspond to growth of boundary $SiO_2$ films in the sequence. Since the $Al_2O_3$ film thickness (=2.0 nm) and the density are considered constant, the amount of photoelectrons in the $Si^{4+}$ bonded state increases, while the amount of photoelectrons in the $Si^{0+}$ bonded state of the substrate decreases along with growth of the $SiO_2$ film at the boundary. Assuming $SiO_2$ ($Si^{4+}$) bonding peak area observed in the Si2p spectra as $I_{Si-O}$, the Si—Si ($Si^{0+}$) bonding peak area of substrate as $I_{Si}$, and the mean free path of photoelectrons as $\lambda$, it is known that the following equation (1) is established relative to the $SiO_2$ film thickness $d_{xps}$ at the boundary (Appl. Phys. Lett., 78 (1996) 6653).

$$(I_{Si-O}/I_{Si-Si})_{30°}=K\{\exp(d_{xps}/\lambda \cdot \sin 30°)-1\} \text{ (}k\text{: constant)} \quad (1)$$

In this study, the $SiO_2$ film thickness ($d_{xps}$) is determined by assuming: $\lambda$=3.9 nm, K=0.45. The $SiO_2$ film thickness ($d_{xps}$) determined according to the equation (1) fits a relation: $d_{EL}=d_{xps}+0.4$ nm relative to the $SiO_2$ film thickness $d_{EL}$ measured by an ellipsometer after removing only the $Al_2O_3$ layer by phosphoric acid. This is because the film thickness measured by the ellipsometer appears larger by so much as the presence of a surface adsorption layer than the actual $SiO_2$ film thickness. Further, it is confirmed that the electric film thickness EOT of an Al/$Al_2O_3$/$SiO_2$/Si capacitor measured after deposition of the Al gate increases correspondingly with (a ratio of 1.0) the increase of the $SiO_2$ boundary film thickness. Further, in view of the dependence of EOT on the $Al_2O_3$ film thickness, the EOT film thickness is extrapolated to zero to determine the boundary $SiO_2$ film thickness. It is confirmed that the boundary $SiO_2$ film thickness determined based on FIG. 10 and the $SiO_2$ film thickness determined by using the equation (1) agree to each other with a difference within 0.1 nm. Table 1 collectively shows the oxidizing heat treatment conditions for the films shown in FIG. 9 and the $SiO_2$ film thickness at the boundary determined by the method described above.

TABLE 1

| # | Temperature (° C.) | Atmosphere | Annealing time (s) | $SiO_2$ film thickness (nm) |
|---|---|---|---|---|
| 0 | 450 | Ar | $7 \times 10^{-4}$ Torr | 600 | 0.1 to 0.2 |
| 1 | 450 | $O_2$ | $7 \times 10^{-4}$ Torr | 600 | 0.2 |
| 2 | 800 | $O_2$ | 100 Torr | 5 | 0.3 |
| 3 | 900 | $O_2$ | 5 Torr | 5 | 0.4 |
| 4 | 950 | $O_2$ | 5 Torr | 5 | 0.5 |
| 5 | 1000 | $O_2$ | 5 Torr | 5 | 0.6 |
| 6 | 1000 | $O_2$ | 10 Torr | 5 | 0.7 |
| 7 | 800 | $O_2$ | 100 Torr | 60 | 1.0 |
| 8 | 1000 | $O_2$ | 760 Torr | 5 | 1.7 |

For the specimen #0 with the least $SiO_2$ film thickness at the boundary, The XPS spectra of Al2p electrons shown in FIG. 9 are to be noted. Peaks were observed at $Al^{3+}$ bonding (75.7 eV) showing the bonding state of $Al_2O_3$ and the lower energy side (73.6 eV). Since the peak is near the $Al^0$ bonding position of metal Al (72.8 eV), this is considered to be a bonding state with less oxygen such as Al—Al—O($Al^{1+}$) than in $Al_2O_3$. It was found that the Al metallic bonding state ($AlO_x$) is put between $Al_2O_3$ and Si and present on the side of the Si substrate by angle resolved XPS spectroscopy. Further, the bonding state was observed only when the $SiO_2$ thickness at the boundary was thin (0.1 nm–0.2 nm).

Figure 5:
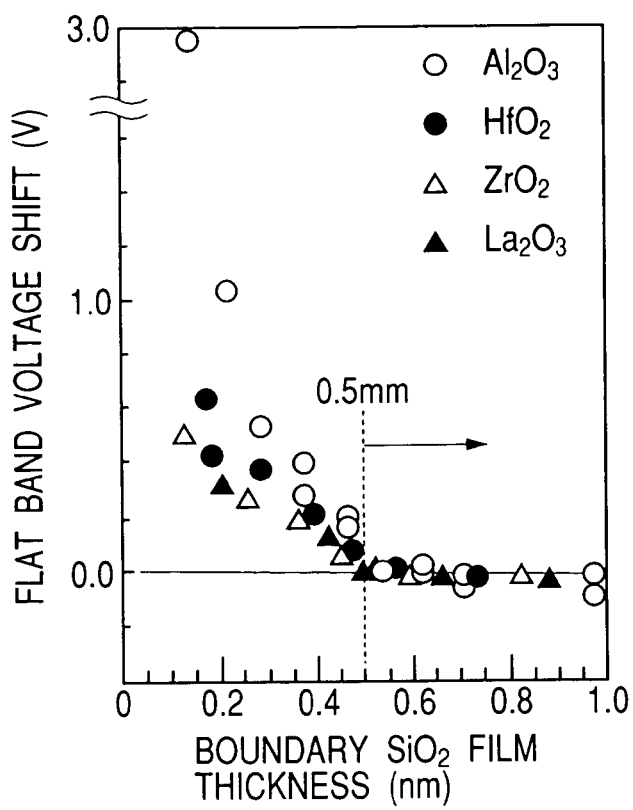
FIG. 5 is a graph showing a relation between an $SiO_2$ film thickness at a high dielectric film/Si substrate boundary and a shift amount $\Delta V_{FB}$ of a flat band.

Then, the dependence of the capacitance-voltage characteristic of an MIS capacitor with an Al/$Al_2O_3$/$SiO_2$/Si structure was examined after depositing the Al gate with respect to the boundary $SiO_2$ film thickness. FIG. 5 shows a relation between the boundary $SiO_2$ film thickness and the shift amount $\Delta V_{FB}$ of the flat band voltage. It can be seen from FIG. 5 that the voltage shifts by about 3.0 V toward the positive voltage when the $SiO_2$ film is thin. This shows that negative fixed charges are present in the film. Then, it was found that $\Delta V_{FB}$ decreases along with increase of the boundary $SiO_2$ film thickness and disappears where a boundary $SiO_2$ film is of 0.5 nm or more. In this study, films were examined for the $SiO_2$ film forming temperature from 300° C. to 1100° C., and it was been confirmed that the characteristics described above do not depend on the temperature for oxidizing heat treatment.

The mechanism for generating negative fixed charges is to be considered. As described above, when the $SiO_2$ film thickness is thin, metallic $AlO_x$ bonding state (state in which O is depleted from $Al_2O_3$) is present stably at the $Al_2O_3$/Si boundary. The generation of negative charges is expected in $AlO_x$ in a state where $Al_2O_3$ is reduced. The amount of fixed charges that is estimated in view of $\Delta V_{FB}$>3.0 V is $4\times10^{13}$/$cm^2$ or more. On the other hand, it is considered that the shift amount of the flat band voltage decreases along with growth of the $SiO_2$ film because the oxygen distribution in $Al_2O_3$ is made uniform and the $AlO_x$ layer decreases. Then, in a case where 0.5 nm $SiO_2$ layer is present, the oxygen distribution at the $Al_2O_3$/$SiO_2$ boundary becomes uniform and the $AlO_x$ layer disappears. The reason why the $AlO_x$ layer is formed when the $SiO_2$ film is thin is because the $Al_2O_3$/Si boundary can not be as abrupt as the $SiO_2$/Si boundary. For matching $Al_2O_3$ with the Si substrate boundary, an $SiO_2$ buffer layer of 0.5 nm or more is necessary. In a case where the $SiO_2$ film thickness is about 0.3 nm, although the $AlO_x$ layer disappears in the XPS spectra for Al2p electrons in FIG. 9 (in a case of #2 in Table 1), a flat band voltage shift was present by about 0.3 V in FIG. 5. The amount of fixed charges estimated in view of $\Delta V_{FB}$=0.3 V is about $4\times10^{12}$/$cm^2$. Considering that the sensitivity of XPS spectroscopy is utmost about at $10^{13}/cm^2$, it can be understood that this can not be observed by XPS measurement.

The first discovery for forming an $Al_2O_3$ gate insulation film excellent in the boundary characteristics which concerns a structure having a boundary $SiO_2$ film of 0.5 nm or more between $Al_2O_3$ and an Si substrate. As to be described later, such films are stable against a thermal load at least of 750° C. or lower. This discovery is applicable also to other high-K insulation films in addition to $Al_2O_3$. FIG. 5 shows the relation between the boundary $SiO_2$ film thickness and the shift amount of the flat band voltage for $HfO_2$, $ZrO_2$, and $La_2O_3$ together. For such films, high speed oxidation treatment is conducted in a pressure-reduced oxygen atmosphere at 300° C. after vapor deposition of metal Hf, Zr or La, and the boundary $SiO_2$ film thickness was controlled by changing the heat treatment time and $O_2$ partial pressure. The $SiO_2$ film thickness was obtained by XPS spectroscopy, TEM measurement and ellipsometer measurement in the same manner as for the $Al_2O_3$ film thickness. The gate electrode is Pt. It can be seen from FIG. 1 that 0.5 nm or more of the boundary $SiO_2$ film is necessary for making the flat band voltage shift to zero also in cases of high dielectric insulation films. It was confirmed that the foregoing conditions are identical also with respect to other rare earth oxides than $Y_2O_3$ or, $La_2O_3$, $HfSiO_4$ and $ZrSiO_4$.

Figure 6:
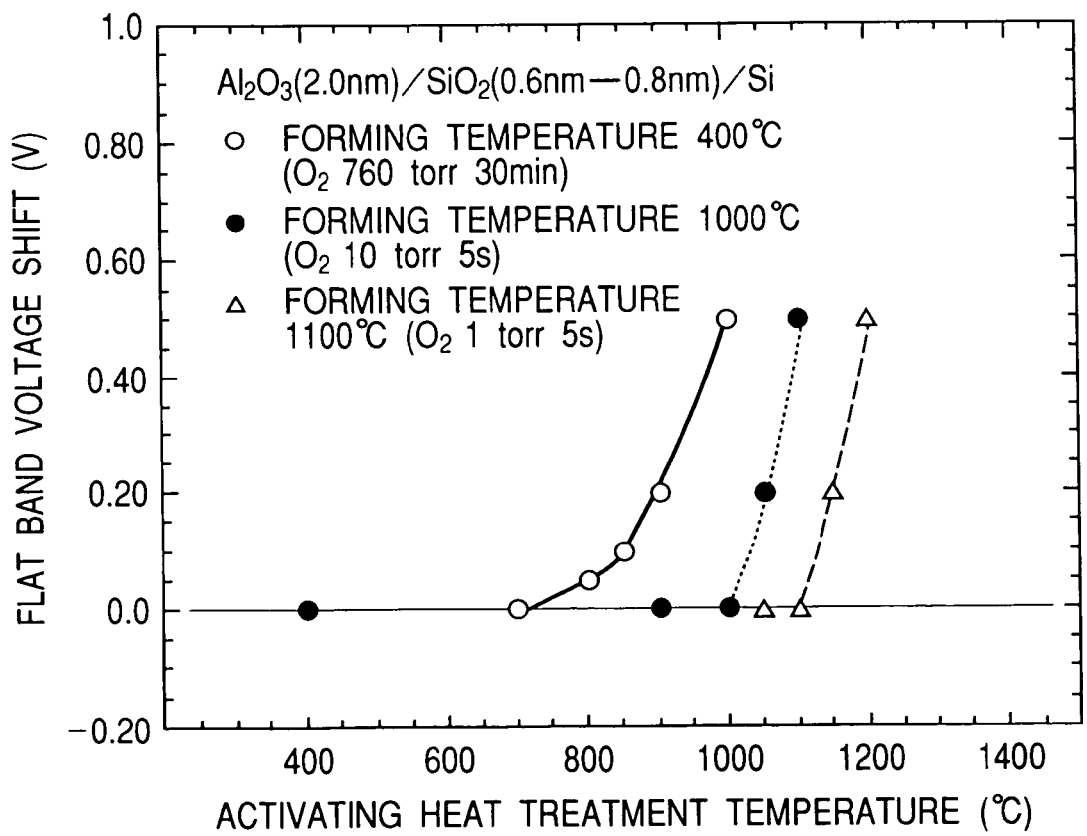
FIG. 6 is a graph showing a relation between a post heat treatment temperature and a shift amount of a flat band voltage ($Al_2O_3$ film)

Now, the relation a between the FET characteristics and the temperature for forming the boundary $SiO_2$ film is to be explained specifically. First, examined the thermal stability of the $Al_2O_3/SiO_2/Si$ structure was examined. After forming the $Al_2O_3/SiO_2/Si$ structure by the oxidizing heat treatment, a post heat treatment was applied in an inert atmosphere. After forming an Al gate electrode, capacitance-voltage measurement was conducted. FIG. 6 shows a relation between the post heat treatment temperature and the shift amount of the flat band voltage. Each of the films has a boundary $SiO_2$ film of 0.5 nm to 0.7 nm thickness, and the shift amount of the flat band voltage just after oxidation is zero. The film applied with the oxidizing heat treatment for film formation at a temperature of 400° C. did not depend on the forming temperature and no flat band voltage shift was caused as long as the post heat treatment temperature was 750° C. or lower. However, when a post heat treatment at 800° C. or higher was conducted, a positive voltage shift was observed for the flat band voltage after the post heat treatment even when a boundary $SiO_2$ film of 0.5 nm or more was present. It is considered that the oxygen distribution in the $Al_2O_3/SiO_2$ boundary was changed by the high temperature heat treatment. However, when the film forming temperature (oxidation treatment temperature) was equal to or higher than the post heat treatment temperature, shift of the flat band voltage was not observed even for a heat treatment temperature of 850° C. or higher. As can be seen from the foregoing result, a film of a structure having a boundary $SiO_2$ film of 0.5 nm or more between $Al_2O_3$ and Si substrate as the invention is stable also after the post heat treatment at 750° C. or lower and it shows the excellent boundary characteristic. The second discovery is a film forming method for forming a boundary $SiO_2$ film of 0.5 nm or more at the boundary between $Al_2O_3$ and Si substrate in an oxidative atmosphere at a temperature higher than the heat treatment temperature in the subsequent step. This can form an insulation film which is stable to a heat treatment at 1100° C. and shows the excellent boundary characteristic. However, in this case, a heat treatment in a diluted oxygen or in a pressure-reduced oxygen atmosphere is necessary for controlling the oxide film thickness by high temperature oxidation. For example, an $SiO_2$ film of 0.6 nm thick can be formed between $Al_2O_3$ and Si substrate by applying a rapid thermal oxidation treatment (RTO treatment) at 100° C. for 5 sec in an atmosphere of $O_2$ partial pressure at 5 torr. Further, an $SiO_2$ film of 0.6 nm thickness can be formed between $Al_2O_3$ and Si substrate by applying an RTO treatment at 100° C. for 5 sec in an atmosphere of $O_2$ partial pressure at 1 torr.

Figure 7:
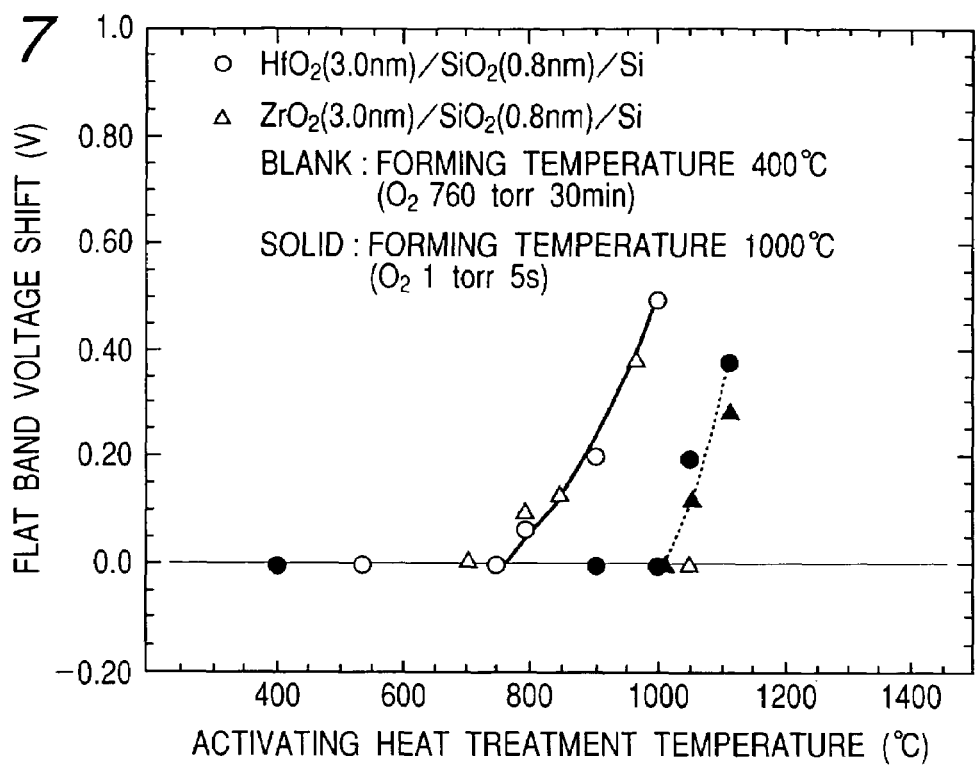
FIG. 7 is a graph showing a relation between a post heat treatment temperature and a shift amount of a flat band voltage (film other than $Al_2O_3$)

The second discovery is effective not only to form the $Al_2O_3$ but also for forming other high dielectric insulation films. For $ZrO_2$ film and $HfO_2$ film, after forming a boundary $SiO_2$ film by a heat treatment in an pressure-reduced oxygen atmosphere, a post heat treatment is conducted in an inert atmosphere. Then, a Pt gate electrode is formed and the dependence of the MIS capacitance on the voltage is measured. FIG. 7 shows a relation between the temperature for the post heat treatment and the flat band voltage shift amount of the MIS capacitor. Each of the films has a boundary $SiO_2$ film of 0.8 nm thick. The film at an oxidation treatment temperature of 400° C. did not depend on the forming temperature and did not form flat band voltage shift when the temperature for the post heat treatment was 750° C. or lower. However, when the post heat treatment was at 800° C. or higher, a positive voltage shift was observed for the flat band voltage in a case of a film applied with a post heat treatment at a temperature higher than the oxidation treatment temperature. It is considered to be attributable to the result of inter-diffusion of Si, O, Hf (Zr) at the boundary between the high dielectric insulation film and $SiO_2$ by the high temperature heat treatment at 800° C. or higher. However, in a case of a film where the boundary $SiO_2$ film was formed in an oxidative atmosphere at a temperature higher than the temperature of the post heat treatment, degradation of the FET characteristic was not observed. As shown by the result, by forming a boundary $SiO_2$ film between the high dielectric insulation film and the Si substrate at a temperature for oxidation treatment higher than that for the heat treatment in the subsequent step, an insulation film which is stable to a heat treatment at 1100° C. and shows the excellent boundary characteristic can be formed. This is applicable not only to $HfO_2$ and $ZrO_2$ but also to rare earth oxides such as $Y_2O_3$, $La_2O_3$, $HfSiO_4$ and $ZrSiO_4$. The situation is identical also for an Hf-added $SiO_2$ film and a Zr-added $SiO_2$ film. However, it is necessary for heat treatment in an atmosphere of diluted oxygen or pressure-reduced oxygen for controlling the thickness of the oxide film by high temperature oxidation. For example, an $SiO_2$ film of 0.7 nm thickness is grown between the high dielectric insulation film and the Si substrate by applying an RTO treatment at 1000° C. for 5 sec in an atmosphere of $O_2$ partial pressure at 1 torr. Further, an $SiO_2$ film of 1.0 nm thickness is grown between the high dielectric insulation film and the Si substrate by applying an RTO treatment at 1100° C. for 5 sec in an atmosphere of $O_2$ partial pressure at 1 torr.

In the foregoings, a necessary boundary $SiO_2$ film was formed between the high dielectric insulation film and the Si substrate by an oxidation heat treatment after forming the high dielectric insulation film, but it may be formed also before deposition of the high dielectric insulation film. For example, by depositing a high dielectric insulation film after forming an $SiO_2$ film of 0.5 nm thickness by thermally oxidizing an Si substrate in an oxidative atmosphere, a film which is stable and shows the excellent boundary property can be formed at a temperature of source-drain activating heat treatment of 750° C. or lower. Further, also in this case, an insulation film having high heat stability and showing excellent boundary characteristic can be formed by controlling the temperature for forming the $SiO_2$ film to higher than the temperature for the source-drain activating heat treatment. However, it is preferred to apply a heat treatment under oxidation conditions not further growing a boundary $SiO_2$ film after forming the high dielectric insulation film. For example, at a temperature of the activating heat treatment at 1000° C., the high dielectric insulation film may be formed as below. An $SiO_2$ substrate is applied with an RTO treatment at 1000° C. for 5 sec in an atmosphere of an $O_2$ partial pressure at 5 torr to form an $SiO_2$ film of 0.5 nm thickness. Then, after further forming a high dielectric insulation film, the RTO treatment is preferably applied at 1000° C. for 5 sec in an atmosphere of an $O_2$ partial pressure at 1 torr.

Further, the $SiO_2$ film between the high dielectric insulation film and the Si substrate can also be replaced with a silicon oxynitrite film (SiON). The film forming method is as below. In the first method, a high dielectric insulation film/$SiO_2$/Si substrate having an $SiO_2$ film of 0.5 nm or more is further applied with an NO treatment thereby introducing N near the $SiO_2$/Si boundary. The NO treatment condition is, for example, a heat treatment for 10 sec in an NO atmosphere at about 900° C. In the second method, an Si substrate is at first oxidized by a heat treatment in an $N_2O$ atmosphere before deposition of a high dielectric insulation film to form an SiON film of 0.5 nm or more. Subsequently, when a high dielectric insulation film is deposited, a film which is stable even at an activating heat treatment of 750° C. and shows the excellent boundary characteristic is formed. For example, an SiON film of 0.5 nm thickness can be formed under the $N_2O$ treatment conditions at 1000° C. for 5 sec in an atmosphere of an $N_2O$ partial pressure at 10 torr. A film of excellent thermal stability can be formed by controlling the temperature for forming SiON film at or higher than the activating heat treatment temperature. However, it is preferred to further apply a heat treatment in an oxidative atmosphere where the boundary $SiO_2$ film is not grown further after forming the high dielectric insulation film. Further, a third method is as described below. An Si substrate is nitrided after cleaning with HF at a temperature of 700° C. or lower in an $NH_3$ atmosphere. The nitride film in this case is about one layer on the Si surface. Then, a high dielectric insulation film is deposited and applied with a heat treatment in an oxidative atmosphere to form an SiON film of 0.5 nm or more at the boundary between the high dielectric insulation film and Si. Also in this case, a film of excellent heat stability can be formed by controlling the heat treatment temperature in the oxidative atmosphere equal to or higher than the activating heat treatment temperature. The fourth method is as shown below. After forming a high dielectric insulation film on an Si substrate, an SiON film of 0.5 nm or more is formed on the boundary by a heat treatment in an $N_2O$ atmosphere. Also in this case, a film of excellent heat stability can be formed by controlling the heat treatment temperature for the oxidative atmosphere equal to or higher than the activating heat treatment temperature. For example, an SiON film of 0.5 nm thickness can be formed by applying a rapid heat treatment at 1000° C. for 5 sec in an atmosphere of an $N_2O$ partial pressure at 10 torr. In the heat treatment, the $N_2O$ heat treatment can be replaced with an NO treatment. By forming the boundary $SiO_2$ film with the four methods described above, the leak current can further be suppressed to ½ or less.

Figure 21:
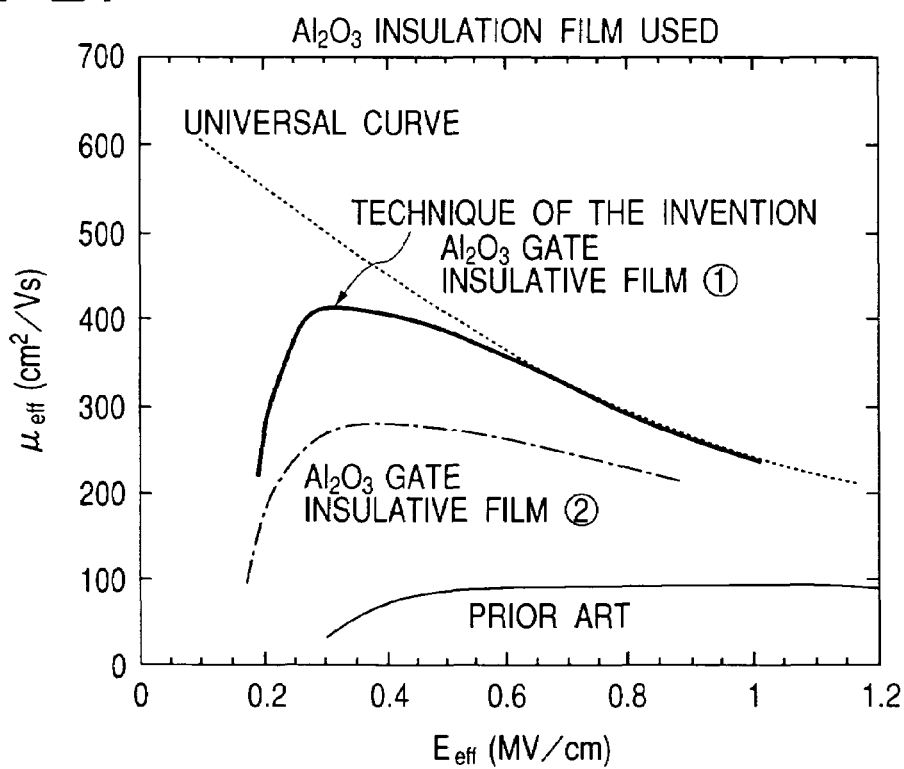
FIG. 21 is a graph showing the dependence of the mobility on the effective field effect for an N-channel type MISFET using $Al_2O_3$ for a gate insulation film.

Now, a relation between the FET characteristic and the material for the gate electrode is described in details as the third discovery. The present inventors at first studied on the $Al_2O_3$ gate insulation film using a polycrystalline silicon gate. After depositing an $Al_2O_3$ film of 1.5 nm thickness, a rapid heat treatment at 1000° C. for 5 sec was conducted in an atmosphere of an $O_2$ pressure at 5 torr, to form a boundary $SiO_2$ film of 0.6 nm thickness, and then a polycrystalline Si gate was formed. Successively, impurity ions were implanted in gate, source and drain regions and a rapid thermal heat treatment was conducted at 1000° C. for 5 sec as an activating heat treatment. Further, after by way of a wire forming step, an MISFET was formed. As a result of measuring the voltage dependence of the capacitance of an MIS capacitor, the $SiO_2$ equivalent thickness of the film was 1.3 nm. However, a flat band voltage shift of +0.3 V was also observed. It is considered that since the boundary between the polycrystalline Si gate electrode and the $Al_2O_3$ could not be abrupt, oxygen in $Al_2O_3$ slightly diffuses into the polycrystalline Si gate electrode to form an $AlO_x$ layer and generate negative fixed charges. The mobility of the N-channel type MISFET is degraded to about ¾ compared with a universal curve of an $SiO_2$ film (general curve giving effective field effect dependence of the mobility) (in a case of the $Al_2O_3$ gate insulation film ② in FIG. 21). It is considered that the degradation is caused by scattering of electrons due to negative fixed charges present at the boundary between the polycrystalline silicon gate and $Al_2O_3$. The mobility in the N-channel type MISFET using $Al_2O_3$ is described in IEDM' 00 Tech. Digest, pp 145, 2000 was degraded to about ¼ compared with the universal curve (prior art in FIG. 21). The reason why the mobility by about three times according to the present invention is perhaps because the static charges on the $Al_2O_3$/Si substrate boundary is decreased according to this invention.

It was found that the fixed charges could be eliminated by forming an $SiO_2$ layer of 0.5 nm thickness on the polycrystalline Si/$Al_2O_3$ boundary. The preparation method is as described below. After the deposition of an $Al_2O_3$ film of 1.0 nm thickness, a first $SiO_2$ film was formed to 0.5 nm thickness by an ALCVD method using $Si_2H_6$ and $H_2O$ Further, a second $SiO_2$ film of 0.5 nm or more was formed on the top the $Al_2O_3$/Si substrate boundary by a heat treatment in an oxidative atmosphere. In a case where the activating heat treatment for source-drain is 800° C. or higher, a rapid heat treatment may be conducted at an oxidation heat treatment temperature of higher than the activating thermal heat temperature, for example, 1000° C. in an atmosphere of an $O_2$ partial pressure at 5 torr for 5 sec. It was found that an FET with no flat band voltage shift and with no degradation of the mobility (the $Al_2O_3$ gate insulation film ① in FIG. 21) by the preparation method described above. However, in this case, since an $SiO_2$ film of 0.5 nm or more was necessary to both of the boundary between $Al_2O_3$ film and the Si substrate and the boundary between the $Al_2O_3$ film and the polycrystalline silicon substrate, this hinders reduction of the thickness of the gate insulation film. For example, the $SiO_2$ equivalent thickness of the gate insulation film formed by the method described above was, for example, 1.6 nm.

Then, materials for high melting temperature metals as the gate electrode material were studied. After forming a TiN film by a reactive sputtering method on an $Al_2O_3$ film (1.5 nm) formed with a boundary $SiO_2$ film to a thickness of 0.5 nm, a W film was deposited by a sputtering method. In this case, no mismatching as observed at the boundary between $Al_2O_3$ and the polycrystalline silicon gate was formed, and excellent boundary characteristic could be maintained. The $SiO_2$ equivalent film thickness of the MIS capacitor was 1.2 nm. The TiN film is necessary for preventing reaction between the gate insulation film and W, which can be replaced with a conductive barrier film such as WN, MoN, TaN, ZrN and HfN. Further, the W electrode may also be replaced with an Mo electrode. Further, by forming a boundary $SiO_2$ film between the $Al_2O_3$ film and the Si substrate at an oxidation treatment temperature higher than the activating heat treatment temperature in the succeeding step, an FET stable to thermal load in the subsequent step can be formed. The boundary $SiO_2$ film may be replaced with an SION film.

While description has been given for the matching property between $Al_2O_3$ and the gate electrode material, a relation between high dielectric insulation films other than $Al_2O_3$ and the gate electrode material was examined. In this case, description is made referring to an $HfO_2$ film as an example. An $HfO_2$ film of 3.0 nm thickness was deposited by an ALCVD method using $HfCl_4$ and $H_2O$. The substrate temperature was 300° C. After the deposition, a rapid heat treatment at 1050° C. for 5 sec was conducted in an atmosphere of an $O_2$ partial pressure at 1 torr to form a boundary $SiO_2$ film of 0.8 nm thickness and then a polycrystalline Si gate was formed. Further, impurity ions were implanted into gate, source and drain regions and a rapid heat treatment at 1050° C. for one sec was conducted as an activating heat treatment. Further, after by way of a wire forming step, an MISFET was formed. As a result of measuring dependence of the capacitance of MIS capacitor on the voltage, the $SiO_2$ equivalent thickness of the film was 1.5 nm. Further, the flat band voltage shift amount was 0.1 V or less and the mobility of the MISFET was substantially identical with a universal curve of an $SiO_2$ film (general curve giving an effective field effect dependence of the mobility). The foregoing result shows that matching property between the polycrystalline Si gate electrode and $HfO_2$ is excellent over $Al_2O_3$. As a result of cross-sectional TEM analysis of the MISFET, a boundary layer of 0.5 nm thickness was observed at the boundary between $HfO_2$ and the polycrystalline silicon. As a result of elemental analysis, it was found that the layer was an $SiO_2$ film slightly incorporated with Hf. Since no reaction layer was found at the boundary between the polycrystalline Si gate electrode and $Al_2O_3$, one of the reasons that causes the difference in matching property therebetween is the presence of the reaction layer. It is estimated that the presence of the boundary layer mainly comprising $SiO_2$ serves as a buffer layer and suppresses the generation of fixed charges. The foregoings were applicable not only to $HfO_2$ but also to $ZrO_2$. On the other hand, in a case of $HfSiO_4$ and $ZrSiO_4$, the reaction layer was not observed but it was confirmed that a film of excellent boundary characteristic could be formed. Further, a high melting temperature metal material can also be used instead of the polycrystalline silicon for the gate electrode. Further, the excellent boundary characteristic can be maintained by stacking a conductive barrier film such as made of TiN, WN, MoN, TaN, ZrN or HfN, and a metal such as W or Mo on the high dielectric insulation film. Further, when a boundary $SiO_2$ film is formed between the high dielectric insulation film and the Si substrate at an oxidation treatment temperature higher than the activating heat treatment temperature, an FET stable to thermal load is formed. Further, the effect of the boundary $SiO_2$ film can be obtained also with an SiON film.

As the gate insulation film, a stacked film of an $Al_2O_3$ film and a high dielectric insulation film other than $Al_2O_3$ can also be used. The preparation method is the same as described below. After forming $Al_2O_3$ of 0.5 nm thickness, for example, by an ALCVD method on an Si substrate, an $HfO_2$ film of 3.0 nm thickness is deposited by the ALCVD method. Then, a rapid heat treatment at 1050° C. for 5 sec in an atmosphere of a pressure-reduced oxygen at 5 torr is conducted to form an $SiO_2$ film of 0.5 nm thickness at the $Al_2O_3$/Si boundary. Further, a polycrystalline Si gate or high melting temperature metal gate was formed by the method described above. The $SiO_2$ equivalent film thickness of the MIS capacitor was 1.3, nm and the flat band voltage shift amount thereof was zero. Further, it was confirmed that the mobility of the N-conductivity type or P-conductivity type MISFET was not degraded. Excellent boundary characteristic was also shown when $ZrO_2$ was used (instead of the $HfO_2$ film).

Figure 10:
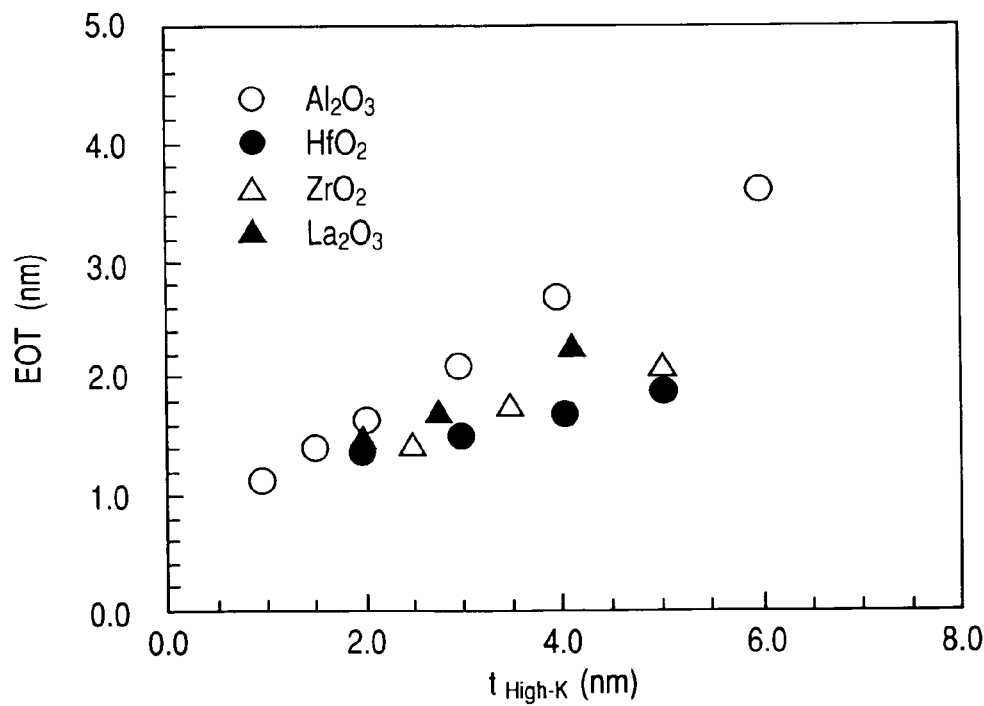
FIG. 10 is a graph showing a relation between an $SiO_2$ equivalent film thickness EOT and a high dielectric insulation film thickness of a high dielectric insulation film/$SiO_2$/Si capacitor.
Figure 11:
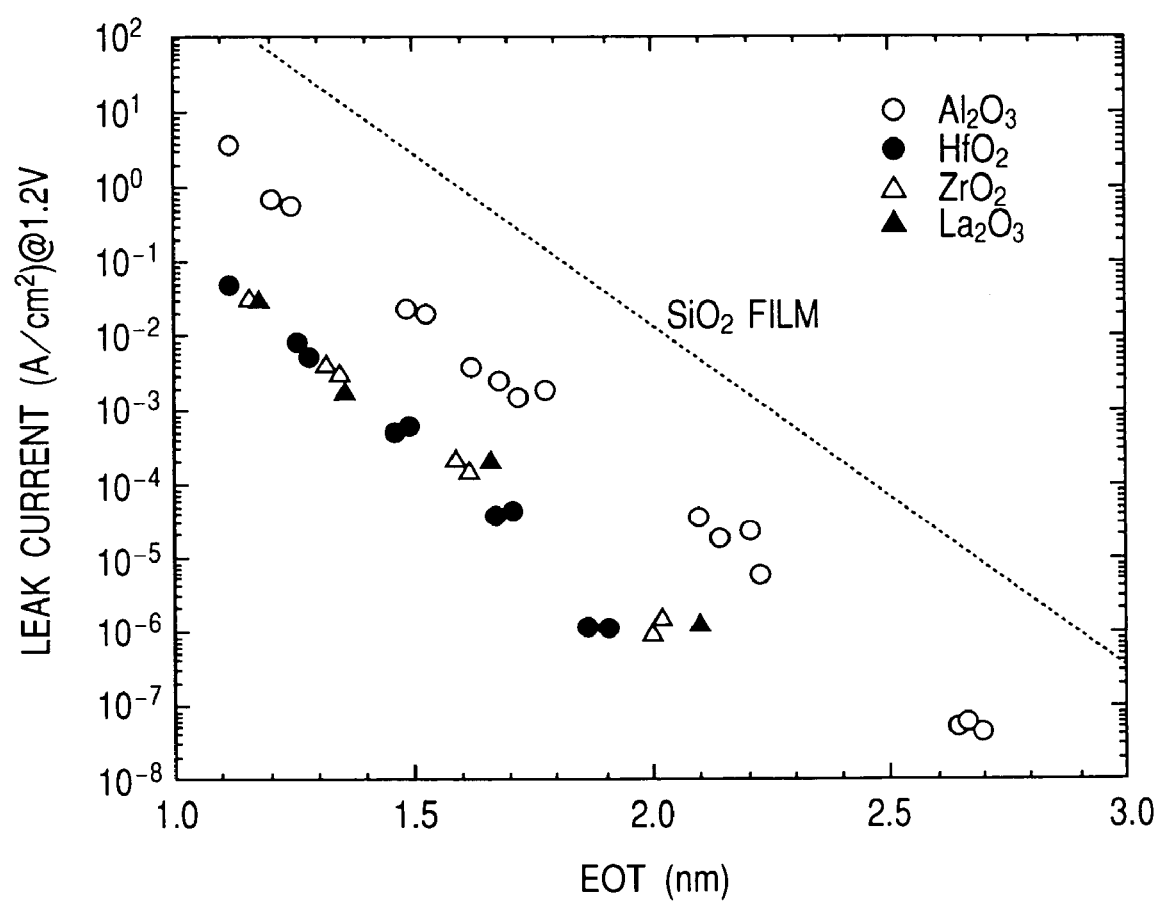
FIG. 11 is a graph showing a relation between an $SiO_2$ equivalent film thickness EOT and a leak current of a high dielectric insulation film/$SiO_2$/Si capacitor.

FIG. 10 shows a relation between the $SiO_2$ equivalent film thickness (EOT) and the thickness of the high dielectric insulation films. The specific dielectric constant for each of high dielectric insulation films is shown according to the slope of lines. Further, by extrapolating the high dielectric insulation film thickness to zero, the $SiO_2$ film thickness at the boundary is decided. For example, in a case of an $Al_2O_3$ film formed by an ECR sputtering method, the specific dielectric constant was 7.8, and the boundary $SiO_2$ film thickness was 0.6 nm. Accordingly, by depositing an $Al_2O_3$ film by 1.0 nm to 3.0 nm, a gate insulation film with equivalent film thickness EOT=1.1 nm to 2.1 nm can be formed. Further, FIG. 11 shows a relation between the leak current and EOT. It shows that the leak current can be suppressed to 1/100 or less that of the $SiO_2$ film by using the high dielectric insulation film.

As described above, this invention concerns a structure of a gate insulation film that provides an FET with excellent boundary characteristic and a film forming method thereof, particularly, an $SiO_2$ (SiON) film at the boundary between the high dielectric insulation film and the Si substrate and a film forming method thereof. Accordingly, while the high dielectric insulation film was deposited by oxidation of metal film, ECR sputtering and ALCVD method in the foregoings. It is apparent that the method is not restricted only thereto.

This invention is described in details with reference to examples. For easy understanding, descriptions are made referring to the drawings, in which main portions are shown in more enlarged scales than other portions. Apparently, materials, conductivity type and manufacturing conditions for each portions are not restricted only to those described in this examples but various other modifications may of course be possible.

<Embodiment 1>

Figure 1:
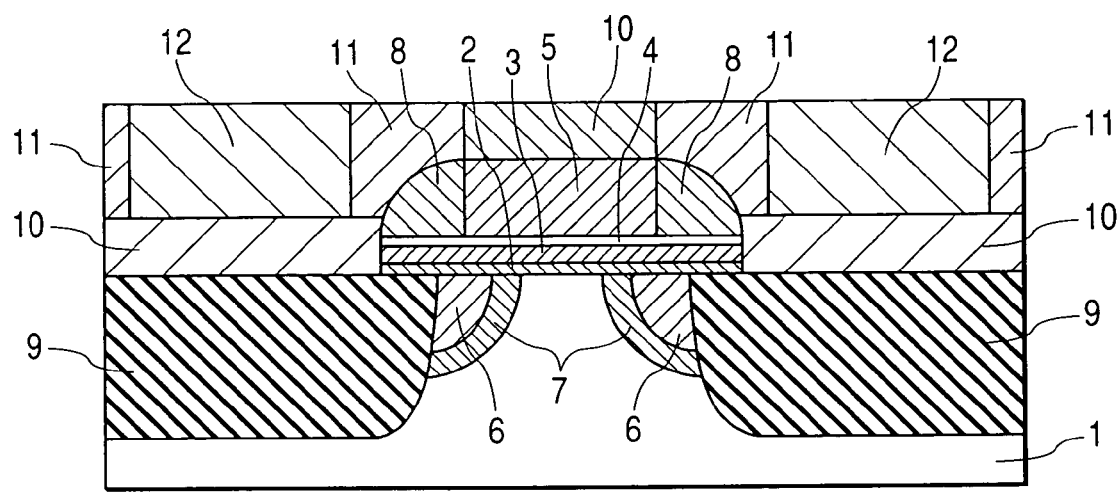
FIG. 1 is a cross-sectional view of a completed high dielectric gate insulation film field effect transistor according to a first embodiment of this invention.
Figure 12:
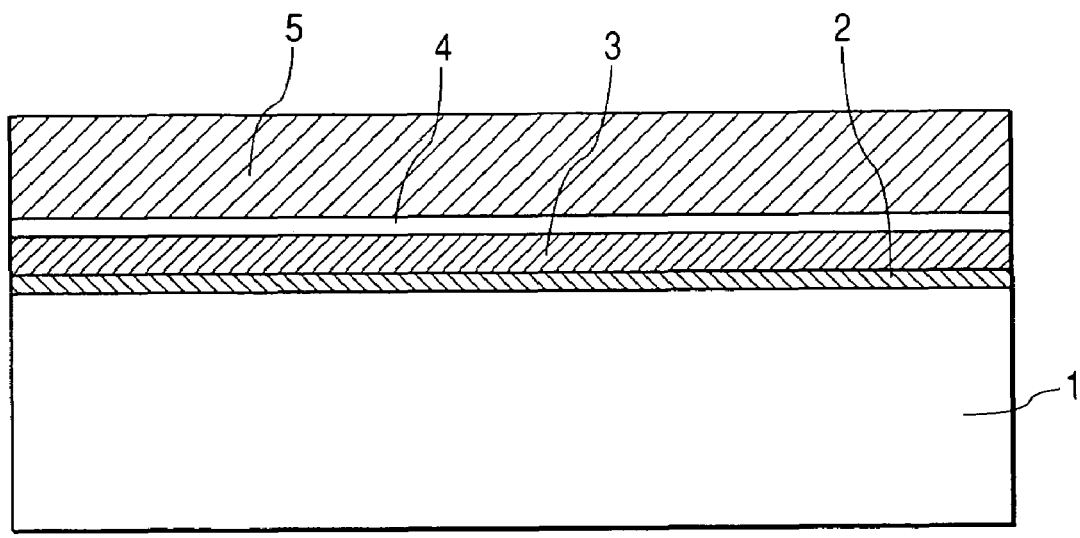
FIG. 12 is a cross-sectional view of the sequence of manufacturing steps for a high dielectric gate insulation film field effect transistor according to a first embodiment of this invention.
Figure 13:
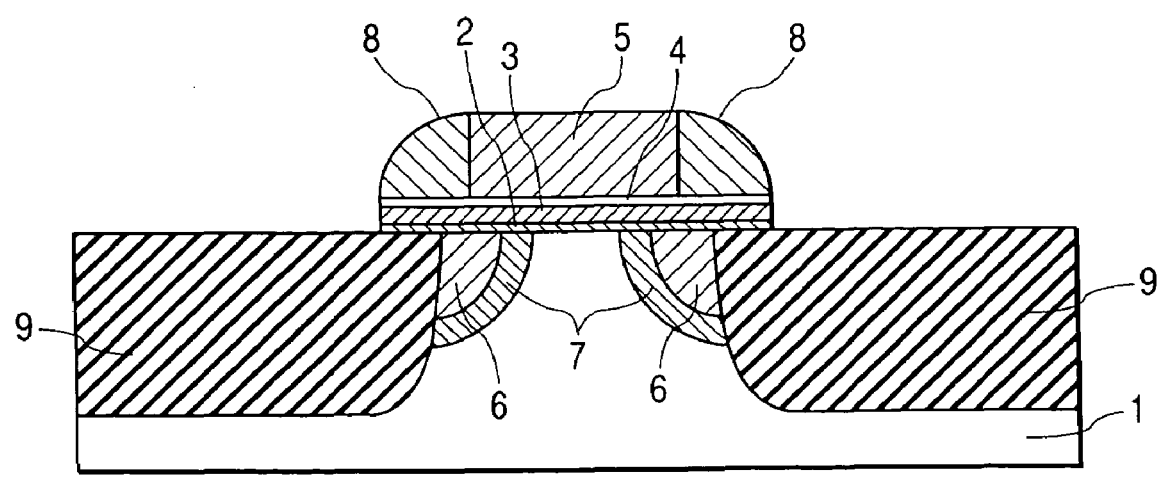
FIG. 13 is a cross-sectional view of the sequence of manufacturing steps for a high dielectric gate insulation film field effect transistor according to a first embodiment of this invention.

FIG. 1 is a cross-sectional view of a completed semiconductor device according to a first embodiment of this invention and FIG. 12 and FIG. 13 are cross-sectional views showing the sequence of production steps thereof.

A semiconductor substrate 1 comprising single crystalline Si of crystal orientation (100), P-conductivity type and 20 cm diameter was formed with an inter-device isolation region (not illustrated) for defining an active region and applied with ion implantation of P-conductivity type ions for controlling the substrate concentration, heat treatment time, ion implantation (for controlling the threshold voltage and the source-drain activating heat treatment by known methods). Then, an $Al_2O_3$ film of 1.0 nm thick was deposited at 350° C. by an atom layer deposition CVD method (ALCVD method) using trimethyl aluminum [$Al(CH_3)_3$] as a starting material gas and $H_2O$ as an oxidizing gas. Further, an $SiO_2$ film was formed to 0.5 nm thickness in the same apparatus by the ALCVD method using $Si_2H_6$ and $H_2O$. Then, a first $SiO_2$ film 2 of 0.6 nm thickness was formed between $Al_2O_3$ and an Si substrate by applying an RTO treatment at 1000°

C. for 5 sec in an atmosphere of an $O_2$ partial pressure at 5 torr. By the described steps, a gate insulation film formed of the first $SiO_2$ film 2 between $Al_2O_3$ and the Si substrate, a high dielectric insulation film 3 ($Al_2O_3$ of 1.0 nm thickness) and a second $SiO_2$ film 4 of 0.5 nm thickness on the $Al_2O_3$ film could be formed.

Further, in-situ phosphorus-doped polycrystalline Si film 5 of 100 nm thickness as a gate electrode 5 was formed. In this example, the in-situ phosphorus-doped polycrystalline Si film 5 was formed by using monosilane ($SiH_4$) and phosphine ($PH_3$) and deposited at a temperature of 630° C. (FIG. 12). For reducing the resistance of the in-situ phosphorus-doped polycrystalline Si film 5, the polycrystalline Si film 5 was formed by selectively implanting ions at high concentration to a desired gate electrode region based on the known manufacturing method for complementary MOS instead of the previously adding impurities. Successively, after conducting a heat treatment for 5 min in a nitrogen atmosphere at 750° C., the in-situ phosphorus-doped polycrystalline Si film 5 was made into the gate electrode.

After forming the gate electrode 5, As ions were implanted at an acceleration energy of 3 keV and at an injection amount of $1\times10^{15}/cm^2$ to form a shallow diffusion layer 6. Thereafter, B ions were implanted in the vertical direction at an acceleration energy of 10 keV and an injection amount of $4\times10^{13}/cm^2$ so as to surround the shallow diffusion layer 6 to form a P-conductivity type punch-through preventive diffusion layer 7 for preventing punch-through. Then, after depositing a silicon oxide film of 50 nm thickness over the entire surface by a plasma-assisted deposition method at a low temperature of 400° C., it was selectively left only on the side wall of the gate electrode 5 by anisotropic dry etching to form a gate side wall insulation film 8. As ions were implanted in the vertical direction at an acceleration energy of 30 keV and an injection amount of $2\times10^{15}/cm^2$ using the gate side wall insulation film 8 as a mask so as to form an N-type high concentration diffusion layer 9 (refer to FIG. 13).

Successively, an activating heat treatment for implanted ions was conducted by nitrogen annealing at 1000° C. for 5 sec. Further, a thin Co film was deposited over the entire surface by sputtering, and silicidation was applied by a short time annealing at 500° C. An unreacted Co film was removed with a mixed solution of hydrochloric acid and aqueous hydrogen peroxide to selectively leave a Co silicide film 10 on an exposed Si substrate portion, and then a short-time heat treatment was applied to reduce the resistance of the Co silicide film 10. Then, after forming a thick silicon oxide deposition layer over the entire surface, the surface was flattened by chemical mechanical polishing to form a surface protection insulation film 11. After forming an opening to a desired region of the surface protection insulation film 11, a TiN film as a diffusion barrier material for the wiring metal and a W film as the wiring metal were deposited, and the W film was left selectively only at the opened portion by the flattening polishing thereof. Then, wirings including source and drain electrodes 12 were formed by deposition and patterning of a metal film comprising aluminum as a main material in accordance with a desired circuit structure to form a field effect transistor (FIG. 1). An MISFET so formed has an $SiO_2$ equivalent film thickness of 1.6 nm. As shown by the relation between the $SiO_2$ boundary film thickness at the $Al_2O_3$/Si boundary and a flat band voltage shift in FIG. 5, a gate insulation film with no fixed charges can be formed by forming an $SiO_2$ film of 0.5 nm thickness or more at the Si and $Al_2O_3$ boundary. Further, as shown by the relation between the temperature of the activating heat treatment and the amount of flat band voltage shift in FIG. 6, an FET showing excellent boundary characteristic with no degradation of the carrier mobility could be formed by controlling the oxidation heat treatment condition upon forming the gate insulation film at a temperature higher than the source-drain activating heat treatment temperature for a source and drain. In a case where the activating heat treatment temperature for the source-drain in the method described above is 1050° C. for one sec, it is necessary that the oxidizing heat treatment upon forming the gate insulation film is an RTO treatment to be applied at 1050° C. for 5 sec in an atmosphere of an $O_2$ partial pressure at 1 torr.

As the high dielectric insulation film 3 of the semiconductor device, $ZrO_2$ or $HfO_2$ is applicable instead of $Al_2O_3$. A $ZrO_2$ film of 2.0 nm thickness is deposited by an atom layer deposition CVD method (ALCVD method) using $ZrCl_4$ as a starting material gas and $H_2O$ as an oxidizing gas at 300° C. Further, in the same apparatus, An $SiO_2$ film was formed to 0.5 nm thickness by an ALCVD method using $Si_2H_6$ and $H_2O$. Then, an $SiO_2$ film 2 of 0.8 nm thickness was formed between $ZrO_2$ and the Si substrate by applying an RTO treatment at 1050° C. for 5 sec in an atmosphere of an $O_2$ partial pressure at 5 torr. By the steps described above, a gate insulation film formed of an $SiO_2$ film 2 of 0.8 nm thickness between $ZrO_2$ and the Si substrate, a dielectric insulation film 3 (2.0 nm, $ZrO_2$), and an $SiO_2$ film 4 of 0.5 nm thickness on the $ZrO_2$ film could be formed. The subsequent preparation method is identical with that has been described above. By the procedures, an MISFET structure with the $SiO_2$ equivalent film thickness of 1.8 nm (FIG. 1) can be formed. As shown in FIG. 5 and FIG. 7, an FET with no degradation of the carrier mobility and showing excellent boundary characteristic could be formed by the formation of the $SiO_2$ film of 0.5 nm or more on the $Si/ZrO_2$ boundary and setting the condition for the oxidizing thermal treatment upon forming the gate insulation film to a temperature higher than the activation heat treatment temperature for a source-drain. In a case of an $HfO_2$ film, comparable characteristics could be obtained by depositing an $HfO_2$ film of 2.0 nm thickness by an ALCVD method using $HfCl_4$ and $H_2O$ and forming an MISFET by the same method as described above. This is applicable not only to $ZrO_2$ or $HfO_2$ but also to rare earth oxides such as $Y_2O_3$, $La_2O_3$, $HfSIO_4$, or $ZrSiO_4$. Also in this case, a heat treatment in an atmosphere of diluted oxygen or pressure-reduced oxygen was necessary for controlling the thickness of the $SiO_2$ film 2 at the boundary between the Si substrate 1 and the high dielectric insulation film 3 by the high temperature oxidation treatment. For example, an $SiO_2$ film 2 of 0.7 nm thickness can be grown between the high dielectric insulation film 3 and the Si substrate 1 by applying an RTO treatment at 1000° C. for 5 sec in an atmosphere of an $O_2$ partial pressure at 1 torr. Further, an $SiO_2$ film 2 of 1.0 nm thickness can be grown between the high dielectric insulation film 3 and the Si substrate 1 by applying an RTO treatment at 1100° C. for 5 sec in an atmosphere of an $O_2$ partial pressure at 1 torr.

Further, the $SiO_2$ layer 4 at the boundary between the high dielectric insulation film 3 and the polycrystalline silicon 5 necessary for the gate insulation film structure of the semiconductor device could also be formed by the following method. Description is made referring to an $HfO_2$ film as an example. An $HfO_2$ film of 2.0 nm thickness was deposited by an ALCVD method using $HfCl_4$ and $H_2O$. The substrate temperature was 300° C. A rapid heat treatment was conducted at 1050° C. for 5 sec in an atmosphere of an $O_2$ pressure at 1 torr to form a boundary $SiO_2$ film 2 to 0.8 nm thickness and then a polycrystalline Si gate 5 was formed. Further, in the same manner as described above, a rapid heat treatment was conducted at 1000° C. for 5 sec as a source-drain activating heat treatment for the source and drain regions to complete an MISFET structure. In this case, as a result of examination by the cross sectional TEM analysis of the gate insulation film structure of the MISFET, a boundary layer of about 0.5 nm thickness was observed at the boundary between $HfO_2$ and the polycrystalline silicon. As a result of elemental analysis, it was found that the layer is an $SiO_2$ film slightly incorporated with Hf. As a result of measuring the dependence of the capacitance of the MIS capacitor on the voltage, the equivalent $SiO_2$ thickness of the film was 1.5 nm. Further, the amount of the flat band voltage shift was about 0.1 V or less, and the electron mobility of MISFET substantially conformed with a universal curve of the $SiO_2$ film (general curve giving an effective field effect dependence of the mobility) Further, in view of the relation between the leak current and EOT shown in FIG. 11, it was found that the gate insulation film could suppress the leak current to 1/1000 or less compared with existent $SiO_2$ films. In a case where an $Al_2O_3$ film was used as the gate insulation film and the $SiO_2$ film 4 was not formed on the $Al_2O_3$, the MIS capacitor showed a flat band voltage shift of 0.3 V toward the positive voltage. Further, the carrier mobility was degraded by 25% compared with a case where the $SiO_2$ film 4 was present. As a result of cross sectional TEM analysis, since no reaction layer was found at the boundary between the polycrystalline Si gate electrode and $Al_2O_3$, it appears that the difference of the characteristics between them is due to the presence of the boundary layer. It is considered that boundary layer mainly comprising $SiO_2$ (a buffer layer) to maintain the matching property between the $HfO_2$ film 3 and the polycrystalline silicon 5 so as to suppress the generation of fixed charges. The boundary layer was formed in a case where the heat treatment after the formation of the polycrystalline silicon was 700° C. or higher. Accordingly, this is considered that oxygen in the $HfO_2$ film 3 and the $SiO_2$ film, and the polycrystalline Si gate were reacted by a high temperature heat treatment. By the preparation method described above, the second $SiO_2$ layer 4 at the boundary between the high dielectric insulation film 3 and the polycrystalline silicon 5 could be formed without deposition. Further, the second boundary $SiO_2$ layer 4 could be formed also with $ZrO_2$ rather than $HfO_2$.

In the foregoings, the necessary first boundary $SiO_2$ film between the high dielectric insulation film and the Si substrate was formed by the oxidation heat treatment after forming the high dielectric insulation film, it is also possible to form before deposition of the high dielectric insulation film. For example, a film which was stable and showing excellent boundary characteristic could be formed also at a subsequent post heat treatment at 750° C. or lower by depositing a high dielectric insulation film after forming the first $SiO_2$ film to 0.5 nm thickness with oxidizing the Si substrate by a heat treatment in an oxidative atmosphere. Further, in this case, an insulation film which was highly heat-stable and showing excellent boundary characteristics could be formed by setting the temperature for forming the first $SiO_2$ film to a temperature higher than that of the post heat treatment. However, it is preferred that a heat treatment is conducted under such an oxidative atmosphere not to grow the first boundary $SiO_2$ film further after forming the high dielectric insulation film.

Further, the first $SiO_2$ film between the high dielectric insulation film and the Si substrate can also be replaced with a silicon oxynitrite film (SiON). The film forming method is as below. In the first method, a high dielectric insulation film/$SiO_2$/Si substrate having a first $SiO_2$ film of 0.5 nm or more formed by the method described above was further applied with an NO treatment thereby introducing N near the $SiO_2$/Si boundary. The NO treatment condition was, for example, a heat treatment for 10 sec in an NO atmosphere at about 900° C. Alternatively, an Si substrate was at first oxidized by a heat treatment in an $N_2O$ atmosphere before deposition of a high dielectric insulation film, to form an SION film of 0.5 nm or more. Subsequently, when a high dielectric insulation film was deposited, a film which was stable even at a post heat treatment of 800° C. and has excellent boundary characteristic could be formed. For example, an SiON film of 0.5 nm thickness could be formed at 1000° C. for 5 sec in an atmosphere of an $N_2O$ partial pressure at 10 torr. A film of excellent thermal stability could be formed by controlling the temperature for forming SiON film to higher than the source-drain activating heat treatment temperature. However, it is preferred to further apply a heat treatment in an oxidative atmosphere where the boundary $SiO_2$ film is not grown further after forming the high dielectric insulation film. Further, a third method is as described below. An Si substrate was nitrided after cleaning with HF at a temperature of 700° C. or lower in an $NH_3$ atmosphere. The nitride film in this case comprised about one layer on the Si surface. Then, a high dielectric insulation film was deposited and applied with a heat treatment in an oxidative atmosphere to form an SiON film of 0.5 nm or more at the boundary between the high dielectric insulation film and Si. Also in this case, a film of excellent heat stability could be formed by controlling the heat treatment temperature in the oxidative atmosphere to higher than the post heat treatment temperature. A fourth method is as shown below. After forming a high dielectric insulation film on an Si substrate, an SiON film of 0.5 nm or more was formed on the boundary by a heat treatment in an $N_2O$ atmosphere. Also in this case, a film of excellent heat stability could be formed by controlling the heat treatment temperature in the oxidative atmosphere to be higher than the post heat treatment temperature. For example, an SiON film of 0.5 nm thickness could be formed by applying a rapid heat treatment at 1000° C. for 5 sec in an atmosphere of an $N_2O$ partial pressure at 10 torr. In the heat treatment, the $N_2O$ heat treatment can be replaced with NO treatment. By forming the boundary $SiO_2$ film by the four methods described above, the leak current could be further suppressed to ½ or less.

In the foregoings, description has been made to a case of depositing $Al_2O_3$, $HfO_2$ and $ZrO_2$ by the ALCVD method, but the deposition method is not restricted only thereto. For embodiment, an rare earth oxide film such as $Al_2O_3$, $HfO_2$, $ZrO_2$, $Y_2O_3$, or $La_2O_3$ can be formed by an ECR sputtering method using a metal target corresponding to a desired metal oxide. The outline of the ECR sputtering apparatus is as shown in FIG. 8. For the metal target corresponding to the desired metal oxide, Ar supplied amount was controlled to 25 sccm, and $O_2$ supplied amount was controlled to 3.0 sccm by a mass flow meter. Then, microwaves at 2.45 GHz was introduced under a constant magnetic field to generate ECR plasmas. The microwave power was 500 W. Further, sputtering could be conducted without oxidizing the surface of the metal target but by applying an RF electric field at 13.56 MHz to the metal ring target. RF power was 500 W. After depositing a high dielectric insulation film by controlling the deposition time so as to obtain a desired film thickness and applying a heat treatment in vacuum at 200° C. to 500° C. in the same apparatus (Ar atmosphere, pressure; $7 \times 10^{-4}$ torr), the substrate may be taken out to the atmospheric air.

Further, after vapor depositing the metal by the RF sputtering method for the metal target, high dielectric insulation film can also be formed by a low temperature oxidation at 400° C. or lower. Further, $HfSiO_4$ ($ZrSiO_4$) could be formed also by a sputtering method using an oxide target or by a CVD method using $HfCl_4$ ($ZrCl_4$), or $SiH_4$ as the starting material, and $H_2O$ as an oxidizing gas.

<Embodiment 2>

Figure 2:
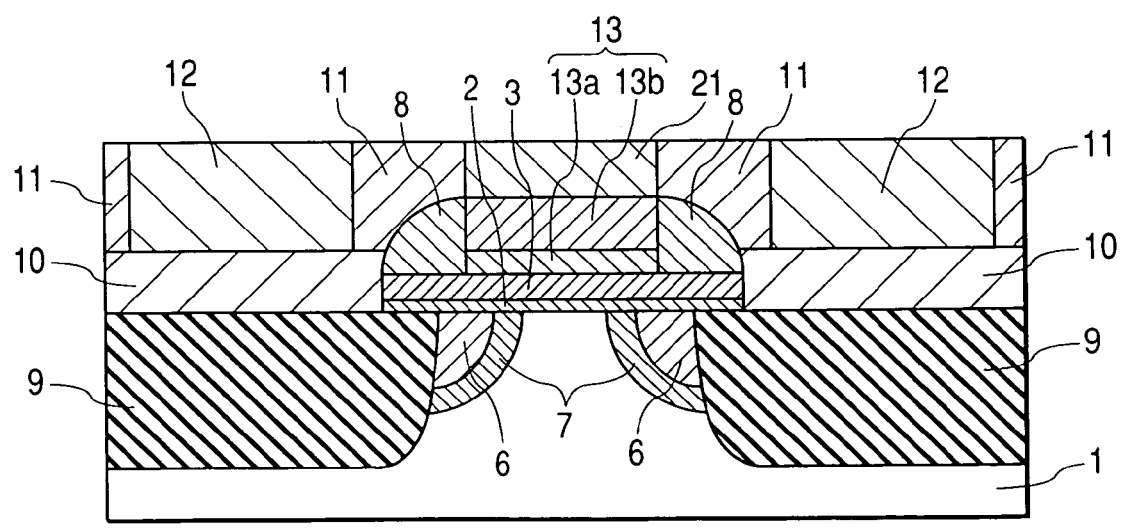
FIG. 2 is a cross-sectional view of a completed high dielectric gate insulation film field effect transistor according to a second embodiment of this invention.
Figure 14:
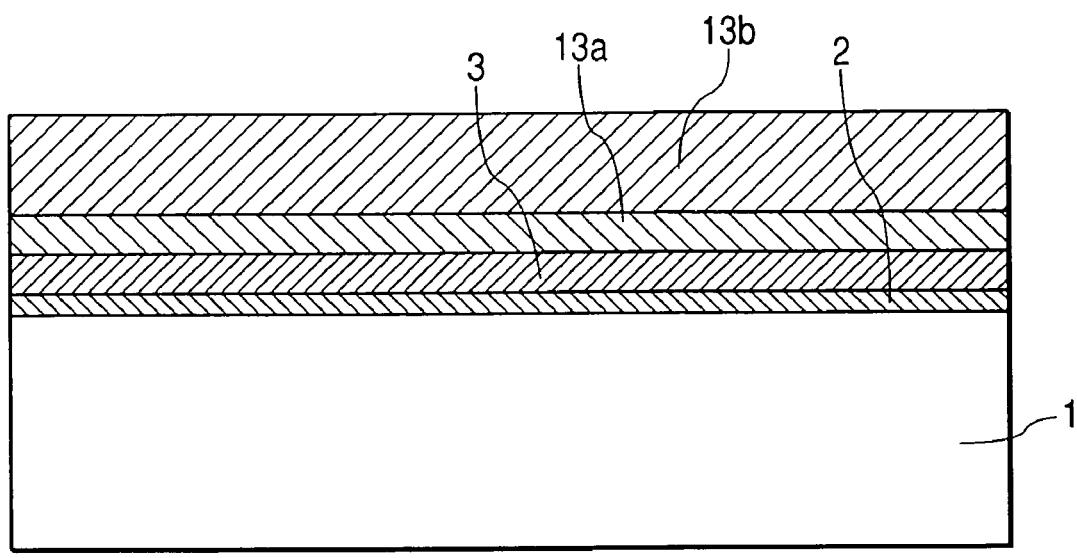
FIG. 14 is a cross-sectional view of the sequence of manufacturing steps for a high dielectric gate insulation film field effect transistor according to a second embodiment of this invention.
Figure 15:
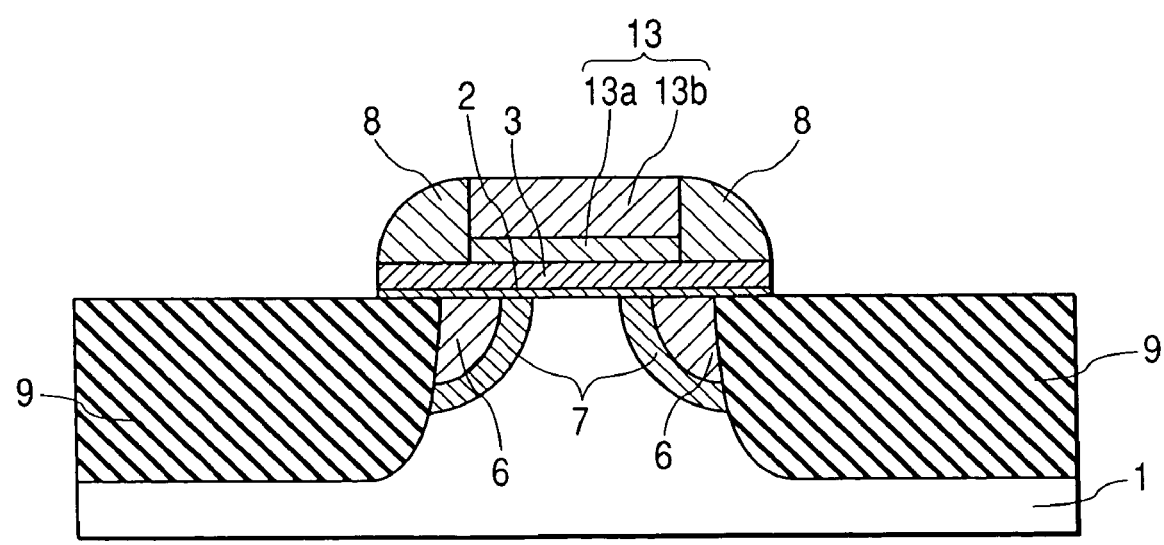
FIG. 15 is a cross-sectional view of the sequence of manufacturing steps for a high dielectric gate insulation film field effect transistor according to a second embodiment of this invention.

FIG. 2 is a cross-sectional view showing a completed field effect transistor according to a second embodiment of this invention, and FIG. 14 and FIG. 15 are schematic views for the production steps thereof. In the field effect transistor according to this Example 2, a high melting metal gate was applied instead of the polycrystalline silicon gate.

A semiconductor substrate 1 comprising single crystalline Si having crystal orientation (100), P-conductivity type and of 20 cm diameter was formed with an inter-device isolation region (not illustrated) for defining an active region and applied with implantation of P-conductivity type ions for controlling the substrate concentration, extended heat treatment time, and ion implantation for controlling the threshold voltage and activating heat treatment by known methods. Subsequently, an $Al_2O_3$ film was formed to a thickness of 1.5 nm by an ECR sputtering method. The ECR sputtering method is as shown in Example 1. However, sputtering time for forming the $Al_2O_3$ of 1.5 nm thickness was set to 9 sec. Then, an $SiO_2$ film of 0.6 nm thickness was formed between the $Al_2O_3$ film 3 and the Si substrate 1 by applying an RTO treatment at 1000° C. for 5 sec in an atmosphere of an $O_2$ particle pressure at 5 torr. Alternatively, a boundary SiON film 2 of 0.7 nm thickness was formed between the $Al_2O_3$ film 3 and the Si substrate 1 by conducting rapid heat treatment at 900° C. for 10 sec in an NO atmosphere. As shown in Example 1, it is also possible to form the $Al_2O_3$ film after forming the siON film. An $SiO_2$ film may be used instead of the siON film.

Then, a TaN gate electrode 13a as a high melting metal nitride was formed by a reactive sputtering method. TiN, WN, MoN, ZrN or HfN may be used instead of TaN. Further, a W gate 13b (or Mo) as a high melting metal was formed by a sputtering method or CVD method (FIG. 14). Further, gate electrodes 13a, 13b were formed by etching using a photoresist film as a mask. As ions were implanted at an acceleration energy of 3 keV and an implantation amount of $1\times10^{15}/cm^2$ to form a shallow diffusion layer 6. Successively, B ions were implanted in the vertical direction so as to surround the shallow diffusion layer 6 at an acceleration energy of 10 keV and an implantation amount of $4\times10^{13}/cm^2$ to form a P-conductivity type punch-through preventive diffusion layer 7 for preventing punch-through. Then, after depositing a silicon oxide film of 50 nm thickness over the entire surface at a low temperature of 400° C. by a plasma-assisted deposition method, it was selectively left only on the side wall of the gate electrode 3 by anisotropic dry etching to form a gate side wall insulation film 8. As ions were implanted in the vertical direction at an acceleration energy of 30 keV and an implantation amount of $2\times10^{15}/cm^2$ using the gate side wall insulation film 8 as an ion implantation inhibitive mask to form an N-type high concentration diffusion layer (FIG. 15).

Thereafter, an activating heat treatment for implanted ions was applied by nitrogen annealing at 1000° C. for 5 sec. Further, a thin Co film was deposited over the entire surface by sputtering, and silicidation was applied by a short-time annealing at 500° C. After removing an unreacted Co film with a mixed solution of hydrochloric acid and aqueous hydrogen peroxide to selectively leave the Co silicide film 9 on an Si substrate exposed portion, reduction of resistance for the Co silicide film 10 was achieved by a short-time heat treatment. Then, after forming a thick silicon oxide deposition film over the entire surface, the surface was flattened by chemical mechanical polishing to form a surface protection insulation film 11. After applying opening to a desired region of the surface protection insulation film 11, a TiN film as a diffusion barrier material for the wiring metal and a W film as the wiring metal were deposited, which were flattened by polishing to selectively leave the W film only in the opened portion. Subsequently, deposition of a metal film made of aluminum as a main material and patterning thereof were applied in accordance with a desired circuit constitution to form wirings including drain and source electrodes 12 to manufacture a field effect transistor (FIG. 2). Thus, an MOSFET with an equivalent $SiO_2$ thickness of 1.3 nm could be formed. As shown by the relation between an $SiO_2$ boundary film thickness at the $Al_2O_3$/Si substrate boundary and a flat band voltage shift shown in FIG. 5, a gate insulation film with no fixed charges could be formed by forming a first $SiO_2$ (SiON) film 2 of 0.5 mm or more at the boundary between the Si substrate 1 and the $Al_2O_3$ film 3. Further, since the matching property at the boundary between the $Al_2O_3$ film 3 and the nitride 13a of high melting metal was satisfactory, no fixed charges were generated. Further, as shown by the relation between the post heat treatment temperature and the shift amount of the flat band voltage in FIG. 6, an FET with no degradation of carrier mobility and showing the excellent boundary characteristic could be formed by setting the oxidation heat treatment temperature upon forming the gate insulation film higher than the activating heat treatment temperature for a source-drain. In the method described above, the leak current could be suppressed to 1/500 compared with that of the $SiO_2$ film, by forming the boundary between the Si substrate 1 and the $Al_2O_3$ film 3 with the SiON film 2.

Instead of the $Al_2O_3$ film, a rare earth oxide such as $HfO_2$, $ZrO_2$, $Y_2O_3$, $La_2O_3$, $HfSiO_4$, or $ZrSiO_4$ film may also be used. The step of forming the boundary $SiO_2$ (SiON) film 2 at the boundary between the high dielectric insulation film 3 and the Si substrate 1 is the same as described in Embodiment 1. However, since the high dielectric insulation film, such as the $Al_2O_3$ film, had a satisfactory boundary matching property with the high melting metal nitride 13a, the $SiO_2$ was not required between the high dielectric insulation film 3 and the high melting metal nitride 13a. Further, the step of forming the FET after forming the high melting metal nitride 13a is the same as described in Embodiment 1. According to this invention in which an $SiO_2$ (SiON) film is formed to 0.5 nm or more at the boundary between the Si substrate and the high dielectric insulation film and the temperature for forming the $SiO_2$ film is set higher than the temperature in the subsequent step, a film of excellent boundary characteristic can be formed.

In the field effect transistor according to Embodiment 2, since the capacitance was not decreased by depletion in the gate electrode in view of the capacitance-voltage characteristic, it was also found that the capacitance increases compared with known field effect transistors using polycrystalline Si. Accordingly, it was found that the field effect transistor according to Embodiment 2 is excellent also in view of the capacitance characteristic.

<Embodiment 3>

Figure 3:
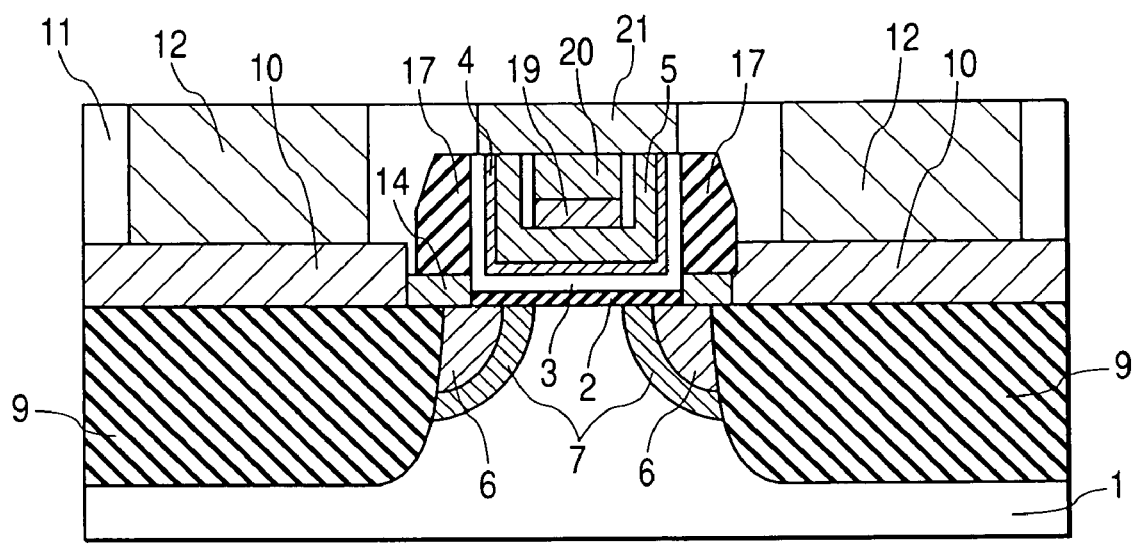
FIG. 3 is a cross-sectional view of a completed high dielectric gate insulation film field effect transistor according to a third embodiment of this invention.

FIG. 3 is a cross sectional view showing a completed field effect transistor in a third embodiment according to this invention and FIG. 16 to FIG. 20 are schematic views for manufacturing steps thereof. In a field effect transistor of this Embodiment 3, an activating heat treatment was applied for implanted ions before formation of the gate insulation film thereby mitigating the thermal load on a high dielectric insulation film.

Figure 16:
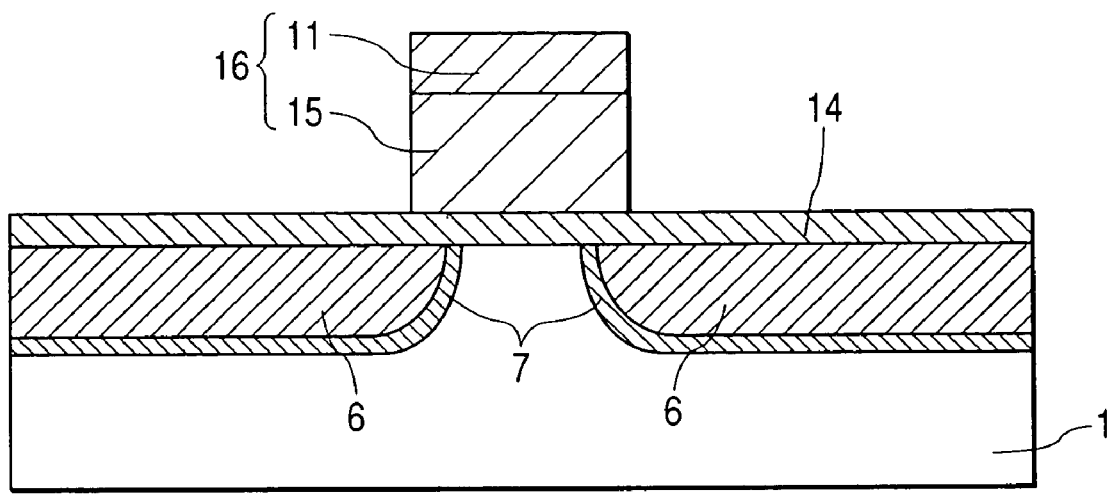
FIG. 16 is a cross-sectional view of the sequence of manufacturing steps for a high dielectric gate insulation film field effect transistor according to a third embodiment of this invention.

A semiconductor substrate 1 comprising single crystalline Si having crystal orientation (100), P-conductivity type and of 20 cm diameter was applied with formation of the inter-device isolation region (not illustrated) for defining an active region, implantation of P-conductivity type ions for controlling the substrate concentration, heat treatment time, and ion implantation (for controlling the threshold voltage and an activating heat-treatment by known methods), and then a thermal oxide film 14 was formed to 5 nm thickness. Then, after depositing an amorphous non-doped Si film 15 to 150 nm thickness on the thermal oxide film 14, a silicon oxide deposition film was deposited by 50 nm thickness to form a surface protection insulation film 11. Subsequently, a dummy gate electrode 16 was formed by using known lithography and etching. After forming the dummy gate electrode, P ions were implanted in the vertical direction at an impurity concentration of about $1 \times 10^{20}/cm^3$ to form a shallow diffusion layer 6. Successively, a heat treatment was applied at 1050° C. for 1 sec to activate the implanted impurities. Successively, B ions were implanted so as to surround the shallow diffusion layer 6 to form a P-conductivity type punch-through preventive diffusion layer 7 for preventing punch-through (FIG. 16).

Figure 17:
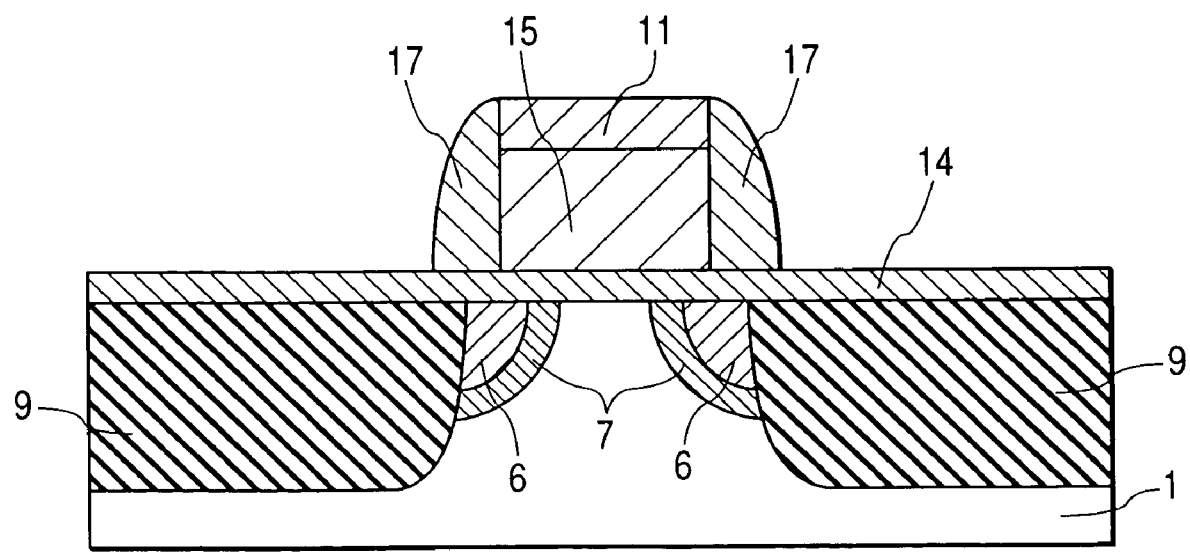
FIG. 17 is a cross-sectional view of the sequence of manufacturing steps for a high dielectric gate insulation film field effect transistor according to a third embodiment of this invention.

Successively, after depositing $Si_3N_4$ over the entire surface, it was left selectively only on the side wall of the dummy gate electrode 18 by anisotropic dry etching to form a dummy gate side wall insulation film 17. After forming an N-type high concentration diffusion layer 9 at an impurity concentration of about $1 \times 10^{20}/cm^3$ using the dummy gate side wall insulation film 17 as an ion injection inhibitive mask, an activating heat treatment for the implanted ions was conducted at 1050° C. for one sec (FIG. 17).

Figure 18:
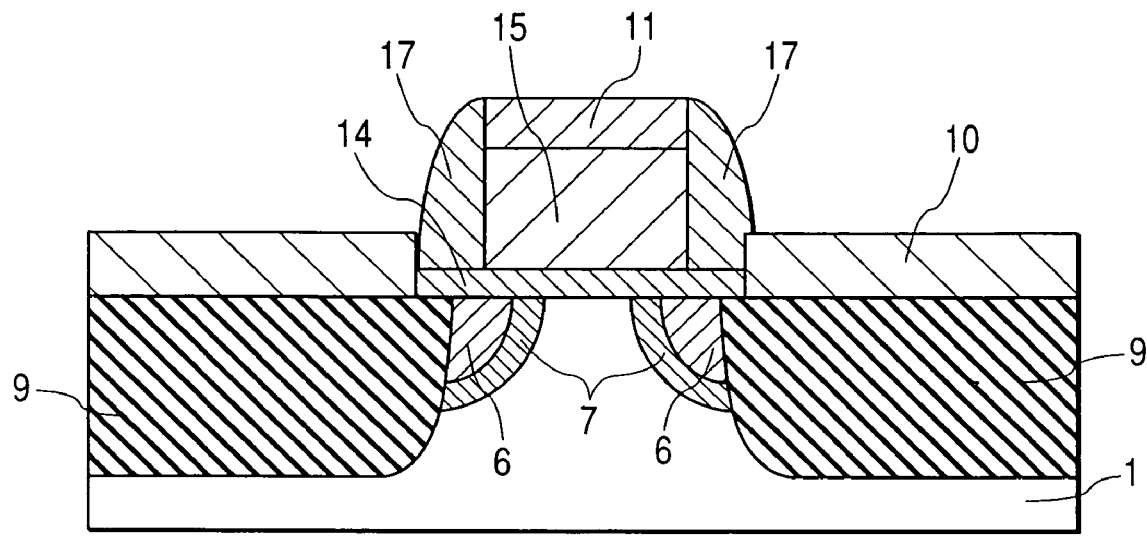
FIG. 18 is a cross-sectional view of the sequence of manufacturing steps for a high dielectric gate insulation film field effect transistor according to a third embodiment of this invention.

Successively, after removing the exposed portion of the $SiO_2$ insulation film 14 by using diluted hydrofluoric acid, a thin Co film was deposited over the entire surface by sputtering, and silicidation was conducted by a short time annealing at 500° C. After removing the unreacted Co film by a mixed solution of hydrochloric acid and aqueous hydrogen peroxide to selectively leave the Co silicide film 10 at the Si substrate exposed portion, and then reduction of resistance for the Co silicide film 12 was conducted by a short-time heat treatment (FIG. 18). By the step, the heat treatment after forming the gate insulation film could be mitigated in this Embodiment 3 compared with the step of forming the Co silicide film 10 after forming the gate insulation film 2 as in Embodiment 1.

Figure 19:
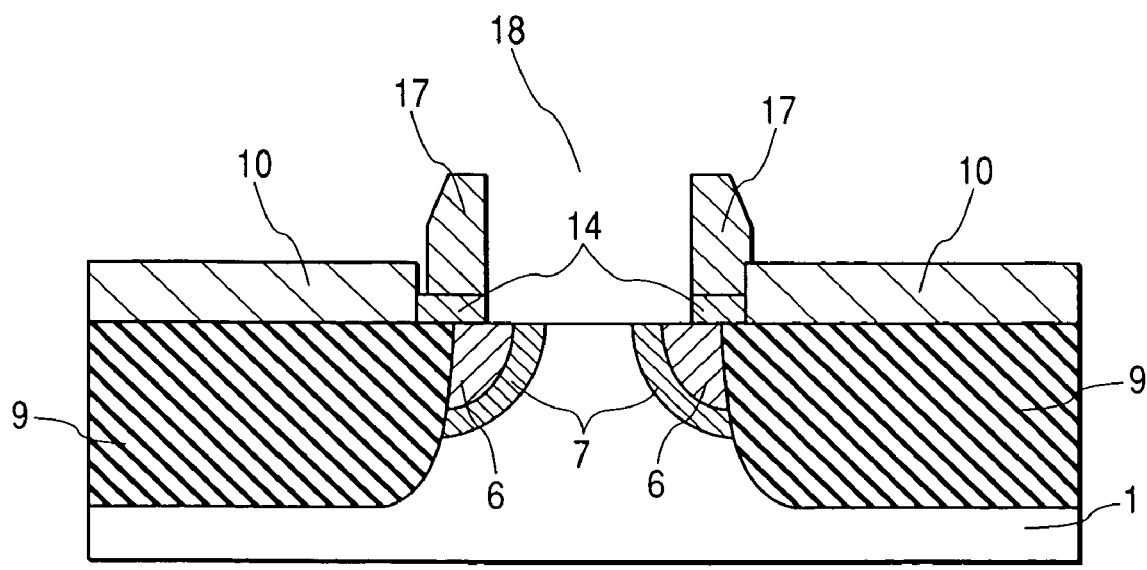
FIG. 19 is a cross-sectional view of the sequence of manufacturing steps for a high dielectric gate insulation film field effect transistor according to a third embodiment of this invention.

Then, after forming a thick silicon oxide deposition film over the entire surface, and then flattening the surface by chemical mechanical polishing to form a surface protection insulative layer 11, annealing was conducted in a nitrogen atmosphere at 800° C. for 30 min. Then, the entire surface was flattened by chemical mechanical polishing to expose the upper surface of the dummy gate electrode 16. Subsequently, after selectively removing the dummy gate electrode 16, the exposed portion of the $SiO_2$ insulation film 14 was removed the by using diluted hydrofluoric acid to form an opening 18 (FIG. 19).

By forming the Co silicide film 10 on the source-drain prior to the formation of the gate insulation film as in this Embodiment 3, thermal load on the gate insulation film or the metal gate electrode could be mitigated. Subsequently, a high dielectric insulation film was deposited in the opening 18 by a CVD method of excellent coverage. For example, in a case of an $Al_2O_3$ film, an $Al_2O_3$ film of 1.0 nm thickness was deposited at 350° C. by an atom layer deposition CVD method (ALCVD method) using trimethyl aluminum [Al $(CH_3)_3$] as a starting material gas and $H_2O$ as an oxidizing gas. Further, in the same apparatus, an $SiO_2$ film 4 was formed to 0.5 nm thickness by an ALCVD method using $Si_2H_6$ and $H_2O$. Then, a first $SiO_2$ film 2 of 0.5 nm thickness was formed between $Al_2O_3$ and the Si substrate by applying an RTO treatment at 700° C. for 60 sec in an atmosphere of an $O_2$ partial pressure at 100 torr. By the steps described above, a gate insulation film comprising an $SiO_2$ film 2 of 0.5 nm thickness between $Al_2O_3$ and the Si substrate, a high dielectric insulation film 3 ($Al_2O_3$ of 1.5 nm thickness) and a second $SiO_2$ film 4 of 0.5 nm thickness on the $Al_2O_3$ film could be formed. In a case of $ZrO_2$, $HfO_2$, $HfSiO_4$, or $ZrSiO_4$, the gate insulation film was formed by using an ALCVD method as described. For example, in a case of a $ZrO_2$ film, a $ZrO_2$ film of 2.0 nm thickness was deposited by an ALCVD method using $ZrCl_4$ and $H_2O$ as the starting material and the reaction gas. The deposition temperature was 300° C. A first $SiO_2$ film 2 of 0.6 nm thickness could be formed between the $ZrO_2$ film and the Si substrate by applying an RTO treatment at 700° C. for 20 sec in an atmosphere of an $O_2$ partial pressure at 10 torr. In the case described above, the heat treatment temperature and time for forming the first $SiO_2$ film at the boundary between the high dielectric insulation film 3 and the Si substrate 1 was so set as not to change the impurity profile of the diffusion layer.

Figure 20:
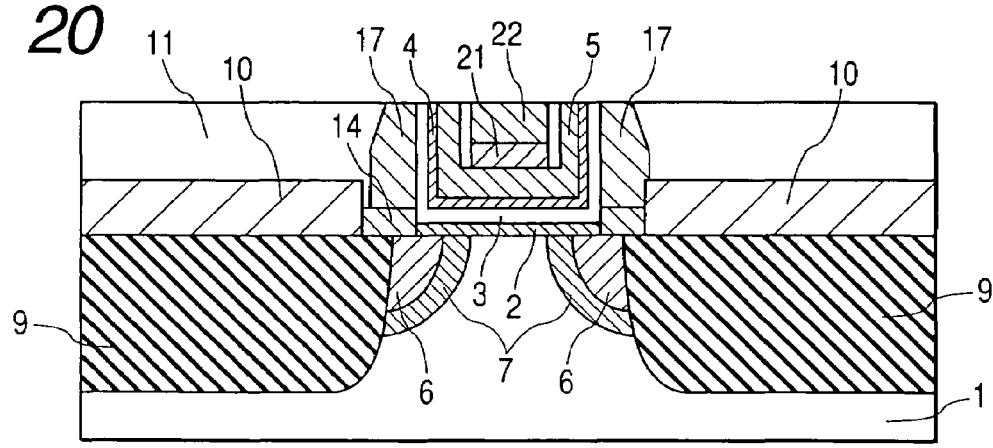
FIG. 20 is a cross-sectional view of the sequence of manufacturing steps for a high dielectric gate insulation film field effect transistor according to a third embodiment of this invention.

Thereafter, an in-situ phosphorus-doped polycrystalline Si film 5 as a gate electrode 5 was deposited to 100 nm thickness in the opening 18 at a temperature of 630° C. by using monosilane ($SiH_4$) and phosphine ($PH_3$). After depositing tungsten nitride of 5 nm thickness by a reactive sputtering method to form a $WN_x$ barrier layer 19, tungsten W of 50 nm thickness was deposited by sputtering to form a W gate electrode 20. Successively, after conducting activating annealing at 700° C. for 20 min, the entire surface was flattened by chemical mechanical polishing to form a transistor structure applied with embedding fabrication (FIG. 20).

Subsequently, after forming a thick silicon oxide deposition film over the entire surface and forming an opening to a desired region of the surface protection insulation film 11, a TiN film as a diffusion barrier material for the wiring metal and a W film as the wiring metal were deposited, which were flattened by polishing to selectively leave the W film only in the opened portion. Finally, deposition of a metal film made of aluminum as a main material and patterning thereof were conducted in accordance with a desired circuit pattern to form wirings including source-drain electrodes 12 and a gate electrode wiring 21 to manufacture a filed effect transistor (FIG. 3). In a case of the $ZrO_2$ film, the $SiO_2$ film at the boundary between the in-situ phosphorus-doped polycrystalline Si film 5 and the $ZrO_2$ film 3 was formed by reaction therebetween upon activating heat treatment at 700° C. The $SiO_2$ layer 4 was formed at the boundary in the same manner as using $HfO_2$. The above-mentioned processing does not restricted to $ZrO_2$. In case of $HfSiO_4$ or $ZrSiO_4$, it was confirmed that although the reaction layer was not observed a film of excellent boundary characteristic could be formed. The $SiO_2$ equivalent film thickness of the capacitor was, for example, 1.5 nm in a case where the high dielectric insulation film 3 was an $Al_2O_3$ film, 1.2 nm in a case it was a $ZrO_2$ film or $HfO_2$ film, and 1.4 nm in a case of $HfSiO_4$ or $ZrSiO_4$.

Further, no degradation of mobility was observed and an FET having excellent boundary characteristic could be obtained.

Also, the first $SiO_2$ film between the high dielectric insulation film and the Si substrate may be replaced with a silicon oxynitride film (SiON). The film forming steps in this case is the same as in Embodiment 1. However, it was necessary that the temperature of the heat treatment for forming the SiON film at the boundary between the high dielectric insulation film 3 and the Si substrate 1 is so adjusted as not to change the impurity profile of the diffusSi substrate. For example, when forming both $SiO_2$ and SiON, the forming temperature is adjusted to be lower than the activating temperature so as not to change the impurity profile since the S/D activation is done before the formation of the gate insulator. The formation time can also be adjusted so as not to change the impurity profile in conjunction with the formation temperature. An FET of excellent boundary characteristic could be formed by forming an $SiO_2$ (SiON) film to 0.5 nm or more at the boundary between the Si substrate and the high dielectric insulation film according to this invention.

<Embodiment 4>

Figure 4:
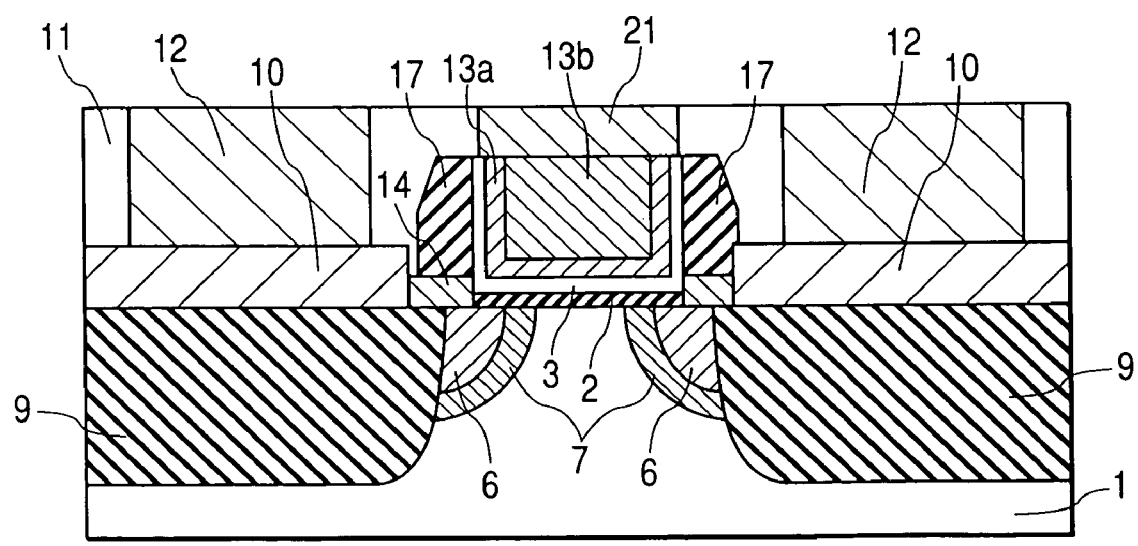
FIG. 4 is a cross-sectional view of a completed high dielectric gate insulation film field effect transistor according to a fourth embodiment of this invention.

This embodiment concerns a method of manufacturing a field effect transistor in which the heat treatment for activating implanted ions was conducted before forming the gate insulation film and the metal gate electrode was used, thereby mitigating the thermal load on the high dielectric insulation film. FIG. 4 is a cross sectional view of a completed field effect transistor of Embodiment 4 according to this invention.

At first, a Co silicide film 10 was formed on source and drain regions to manufacture a structure 18 in which a channel area was opened as shown in FIG. 19 by the same step as in Embodiment 3. Successively, a high dielectric insulation film was deposited in the opening 18 by the CVD process of excellent coverage by the same step as in Embodiment 3. For example, in a case of an $Al_2O_3$ film, an $Al_2O_3$ film of 1.5 nm thickness was deposited at 350° C. by an atom layer deposition CVD method (ALCVD method) using trimethyl aluminum $[Al(CH_3)_3]$ as a starting material gas and $H_2O$ as an oxidizing gas. Then, an $SiO_2$ film 2 of 0.5 nm thickness was formed between $Al_2O_3$ and the Si substrate by applying an RTO treatment at 700° C. for 60 sec in an atmosphere of an $O_2$ partial pressure at 100 torr. By the steps described above, a gate insulation film comprising an $SiO_2$ film 2 of 0.5 nm thickness between $Al_2O_3$ and the Si substrate and a high dielectric insulation film 3 ($Al_2O_3$ of 1.50 nm thickness) could be formed. In a case of $ZrO_2$, $HfO_2$, $HfSiO_4$ or $ZrSiO_4$, the gate insulation film was formed by using an ALCVD method as described below. For embodiment, in a case of an $HfO_2$ film, a $HfO_2$ film of 3.0 nm thickness was deposited by an ALCVD method using $HfCl_4$ and $H_2O$ as the starting material and the reaction gas. The deposition temperature was 300° C. An $SiO_2$ film 2 of 0.6 nm thickness was formed between the $HfO_2$ film and the Si substrate by applying an RTO treatment at 700° C. for 20 sec in an atmosphere of an $O_2$ pressure at 10 torr. In the case described above, the heat treatment temperature for forming the $SiO_2$ film at the boundary between the high dielectric insulation film 3 and the Si substrate 1 was set to such temperature and time as not changing the impurity profile of the diffusion layer.

Successively, TaN to form a high melting metal nitride film 13a was vapor deposited to 20 nm thickness in the opening 18 by using an ALCVD method. While TaN was used in this Embodiment 4, it may be TiN, WN, MoN, ZrN or HfN. Further, W or Mo was formed as a high melting metal film 13b by sputtering or CVD. Subsequently, after forming a thick silicon oxide deposition film over the entire surface, it was flattened entirely by chemical mechanical polishing to form a transistor structure applied with embedding fabrication. Then, after forming an opening to a desired region of the surface protection insulation film 11, a TiN film as a diffusion barrier material for the wiring metal and a W film as the wiring metal were deposited, which were flattened by polishing to leave the W film selectively only in the opening portion. Finally, deposition of a metal film made of aluminum as a main material and patterning thereof were conducted in accordance with a desired circuit pattern to form wirings including source-drain electrodes 12 and a gate electrode wiring 21 to manufacture a field effect transistor (FIG. 4). In the MISFET formed by the method described above, the $SiO_2$ equivalent film thickness of the capacitor was, for example, 1.2 nm in a case where the high dielectric insulation film is an $Al_2O_3$ film, 1.1 nm in a case it was a $ZrO_2$ or $HfO_2$ film, and 1.2 nm in a case it was $HfSiO_4$ or $ZrsiO_4$. In this embodiment, since matching property at the boundary between the $Al_2O_3$ film 3 and the metal gate 13 was satisfactory, no second boundary $SiO_2$ film was required as in the case of the polycrystalline Si gate. Further, in the case of $ZrO_2$, $HfO_2$, $HfSiO_4$, or $ZrSiO_4$, no reaction layer was formed on the boundary of the metal gate electrode. As a result of the evaluation for the FET manufactured in the embodiment described above, no degradation of mobility was observed and it was confirmed that it had excellent boundary characteristic.

Also, the first $SiO_2$ film between the high dielectric insulation film and the Si substrate may be replaced with the silicon oxynitride film (SiON). The film forming steps in this case are the same as in Embodiment 1. However, it was necessary that the temperature of the heat treatment for forming the first $SiO_2$ film at the boundary between the high dielectric insulation film 3 and the Si substrate 1 so set as not to change the impurity profile of the diffusion layer. An FET of excellent boundary characteristic could be formed by forming the first $SiO_2$ (SiON) film to 0.5 nm or more at the boundary between the Si substrate and the high dielectric insulation film according to this invention. Further, in the field effect transistor of this Embodiment 4, since capacitance was not decreased by depletion in the gate electrode to the capacitance-voltage characteristic, it was also found that the capacitance is increased compared with known field effect transistors using polycrystalline Si.

The principles, preferred embodiments and modes of operation of the present invention have been described in the foregoing specification. However, the invention which is intended to be protected is not limited to the particular embodiments disclosed. The embodiments described herein are illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A semiconductor device having a field effect transistor which comprises a gate electrode formed over a silicon substrate and a high dielectric gate insulation film formed between said gate electrode and said silicon substrate, said high dielectric gate insulation film comprising:

a metal oxide film having a higher dielectric constant than that of a silicon oxide film; and a first silicon oxide film or a silicon oxynitride film formed between said silicon substrate and said metal oxide film, wherein said high dielectric gate insulation film has an $SiO_2$ equivalent thickness in a range of 0.5–2.0 nm, and wherein said first silicon oxide film or said silicon oxynitride film has a thickness of 0.5 nm or more.

2. A semiconductor device according to claim 1, wherein said metal oxide film is a rare earth oxide layer made of one of $Al_2O_3$, $ZrO_2$, $HfO_2$, $ZrSiO_4$, $HfSiO_4$, $Y_2O_3$ and $La_2O_3$, or a rare earth oxide layer made of one of $ZrO_2$, $HfO_2$, $ZrSiO_4$, $HfSiO_4$, $Y_2O_3$, and $La_2O_3$ formed on a $Al_2O_3$ layer.

3. A semiconductor device according to claim 1, wherein said gate electrode comprises a polycrystalline silicon film, wherein said high dielectric gate insulation film further comprises a second silicon oxide film formed between said metal oxide film and said polycrystalline silicon film, and wherein said second silicon oxide film has a thickness of 0.5 nm or more.

4. A semiconductor device according to claim 1, wherein said gate electrode further comprises a high melting temperature metal film formed on said metal oxide film.

* * * * *